United States Patent
Lee et al.

(10) Patent No.: US 8,537,621 B2
(45) Date of Patent: Sep. 17, 2013

(54) NON-VOLATILE MEMORY DEVICE AND READ METHOD THEREOF

(75) Inventors: Ji-Sang Lee, Hwasung (KR); Kihwan Choi, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 317 days.

(21) Appl. No.: 13/094,192

(22) Filed: Apr. 26, 2011

(65) Prior Publication Data

US 2012/0137067 A1 May 31, 2012

(30) Foreign Application Priority Data

Nov. 25, 2010 (KR) .................. 10-2010-0117947

(51) Int. Cl.
*G11C 16/06* (2006.01)

(52) U.S. Cl.
USPC ............. 365/185.21; 365/185.17; 365/185.23

(58) Field of Classification Search
USPC ............. 365/185.21, 185.22, 185.17, 185.23, 365/189.15, 230.06
See application file for complete search history.

(56) References Cited

U.S. PATENT DOCUMENTS

| | | | |
|---|---|---|---|
| 6,067,248 A * | 5/2000 | Yoo | 365/185.03 |
| 6,858,906 B2 | 2/2005 | Lee et al. | |
| 7,436,733 B2 | 10/2008 | Mokhlesi | |
| 7,529,124 B2 | 5/2009 | Cho et al. | |
| 7,535,769 B2 | 5/2009 | Cernea | |
| 7,551,487 B2 * | 6/2009 | Park et al. | 365/185.22 |
| 7,684,237 B2 | 3/2010 | Moschiano et al. | |
| 2004/0169238 A1 | 9/2004 | Lee et al. | |
| 2006/0180851 A1 | 8/2006 | Lee et al. | |
| 2007/0030755 A1 * | 2/2007 | Ahn | 365/233 |
| 2007/0211537 A1 * | 9/2007 | Park et al. | 365/185.22 |

FOREIGN PATENT DOCUMENTS

| | | |
|---|---|---|
| JP | 2007035124 A | 2/2007 |
| KR | 20070034201 A | 10/2008 |

* cited by examiner

*Primary Examiner* — Gene Auduong
(74) *Attorney, Agent, or Firm* — Harness, Dickey & Pierce

(57) ABSTRACT

In one embodiment, the method includes receiving a request to read data stored in a first memory cell associated with a first word line, and performing a first read operation on at least one memory cell associated with a second word line in response to the request. The second word line follows the first word line in a word line programming order, and the first read operation is performed over a first time period. The method further includes performing a second read operation on the first memory cell based on output from the first read operation. The second read operation is performed for a second time period, and the first time period is shorter than the second time period if output from performing the first read operation indicates the first memory cell is not coupled.

27 Claims, 28 Drawing Sheets

Normal sensing

Accelerated sensing

Normal Read Time :

T1

Accelerated Read Time :

T2

Normal sensing

Accelerated sensing

NON-VOLATILE MEMORY DEVICE AND READ METHOD THEREOF

CROSS-REFERENCE TO RELATED APPLICATION

This application claims priority on Korean Application No. 10-2010-0117947 filed Nov. 25, 2010, the entire contents of which are hereby incorporated by reference.

BACKGROUND

1. Field

Example embodiments relate to an electronic device, and more particularly, relate to a memory system.

2. Description of the Related Art

Semiconductor memories are usually considered to be the most vital microelectronic component of digital logic system design, such as computers and microprocessor-based applications ranging from satellites to consumer electronics. Therefore, advances in the fabrication of semiconductor memories including process enhancements and technology developments through the scaling for higher densities and faster speeds help establish performance standards for other digital logic families.

Semiconductor memory devices may be characterized as volatile random access memories (RAMs), or non-volatile memory devices. In RAMs, the logic information is stored either by setting up the logic state of a bistable flip-flop such as in a static random access memory (SRAM), or through the charging of a capacitor as in a dynamic random access memory (DRAM). In either case, the data are stored and can be read out as long as the power is applied, and the data are lost when the power is turned off; hence, they are called volatile memories.

Non-volatile memories, such as Mask Read-Only Memory (MROM), Programmable Read-Only Memory (PROM), Erasable Programmable Read-Only Memory (EPROM), and Electrically Erasable Programmable Read-Only Memory (EEPROM), are capable of storing the data, even with the power turned off. The non-volatile memory data storage mode may be permanent or reprogrammable, depending upon the fabrication technology used. Non-volatile memories are used for program and microcode storage in a wide variety of applications in the computer, avionics, telecommunications, and consumer electronics industries. A combination of single-chip volatile as well as non-volatile memory storage modes is also available in devices such as non-volatile SRAM (nvSRAM) for use in systems that require fast, programmable non-volatile memory. In addition, dozens of special memory architectures have evolved which contain some additional logic circuitry to optimize their performance for application-specific tasks.

In non-volatile memories, however, MROM, PROM, and EPROM are not free to be erased and written to by a system itself, so that it is not easy for general users to update stored contents. On the other hand, EEPROM is capable of being electrically erased or written. Application of the EEPROM has widened to an auxiliary memory or to system programming where continuous updates are needed (flash EEPROM).

SUMMARY

The present invention relates to a method for reading memory cells in an array of non-volatile memory cells.

In one embodiment, the method includes receiving a request to read data stored in a first memory cell associated with a first word line, and performing a first read operation on at least one memory cell associated with a second word line in response to the request. The second word line follows the first word line in a word line programming order, and the first read operation is performed over a first time period. The method further includes performing a second read operation on the first memory cell based on output from the first read operation. The second read operation is performed for a second time period, and the first time period and the second time period are different.

In another embodiment, the method includes receiving a request to read data stored in a first memory cell associated with a first word line, and determining if the first memory cell is in one of a coupled state and an uncoupled state by performing a first read operation on at least one memory cell of a second word line. The second word line follows the first word line in a word line programming order, and the first read operation is performed for a first time period. The method further includes performing a second read operation on the first memory cell based on output from the first read operation. The second read operation is performed for a second time period, and the second time period is different than the first period of time.

In a further embodiment, the method includes receiving a request to read data stored in a first memory cell associated with a first word line, and determining whether at least one memory cell associated with a second word line has been programmed. The second word line follows the first word line in a word line programming order. The method further includes performing a first read operation on a memory cell of the second word line corresponding to the first memory cell if the determining step determines that at least one memory cell associated with the second word line has been programmed. The first read operation is performed over a first time period. A second read operation is performed on the first memory cell based on at least one of (1) whether the determining step determines that at least one memory cell associated with a second word line has been programmed and (2) output from the first read operation. The second read operation is performed for a second period of time different than the first period of time.

In yet another embodiment, the method includes receiving a request to read data stored in a first memory cell associated with a first word line, and performing a first read operation on at least one memory cell associated with a second word line in response to the request. The second word line follows the first word line in a word line programming order, and the first read operation is performed over a first time period. The method further includes performing a second read operation on the first memory cell based on output from the first read operation. The second read operation is performed for a second time period, and the first time period is shorter than the second time period if output from performing the first read operation indicates the first memory cell is not coupled.

In an additional embodiment, the method includes receiving a request to read data stored in a first memory cell associated with a first word line, and determining whether at least one memory cell associated with a second word line has been programmed. The second word line follows the first word line in a word line programming order. The method further includes performing a first read operation on a memory cell of the second word line corresponding to the first memory cell if the determining step determines that at least one memory cell associated with a second word line has been programmed. The first read operation is performed over a first time period. A second read operation is performed on the first memory cell based on at least one of (1) whether the determining step determines that at least one memory cell associated with a second word line has been programmed and (2) output from the first read operation. The second read operation is performed for a second time period. The first time period is shorter than the second time period if output from one of the determining step and the first read operation indicates the first memory cell is not coupled.

In another embodiment, the method includes accessing a map in response to a request to read data stored in a first memory cell associated with a first word line. The map indicates which word lines have had at least one memory cell programmed. The method further includes triggering a first read operation and a second read operation if the accessing indicates that at least one memory cell in the second word line has been programmed. The first read operation reads at least one memory cell in a second word line that corresponds to the first memory cell. The second word line follows the first word line in a word line programming order, and the second read operation reads the first memory cell based on output from the first read operation.

The present invention also relates to a non-volatile memory device.

In one embodiment, a non-volatile memory device includes an array of non-volatile memory cells arranged in rows coupled by word lines and columns coupled by bit lines, and control logic configured to receive a request to read data stored in a first memory cell associated with a first word line. The control logic is configured to perform a first read operation on at least one memory cell associated with a second word line in response to the request. The second word line follows the first word line in a word line programming order, and the first read operation is performed over a first time period. The control logic is configured to perform a second read operation on the first memory cell based on output from the first read operation. The second read operation is performed for a second time period, and the first time period is shorter than the second time period if output from performing the first read operation indicates the first memory cell is not coupled.

Embodiments are also directed towards an electronic device, memory card, data storage device, etc. and method of operation associated therewith that incorporate embodiments of the memory device or method of reading according the present invention.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
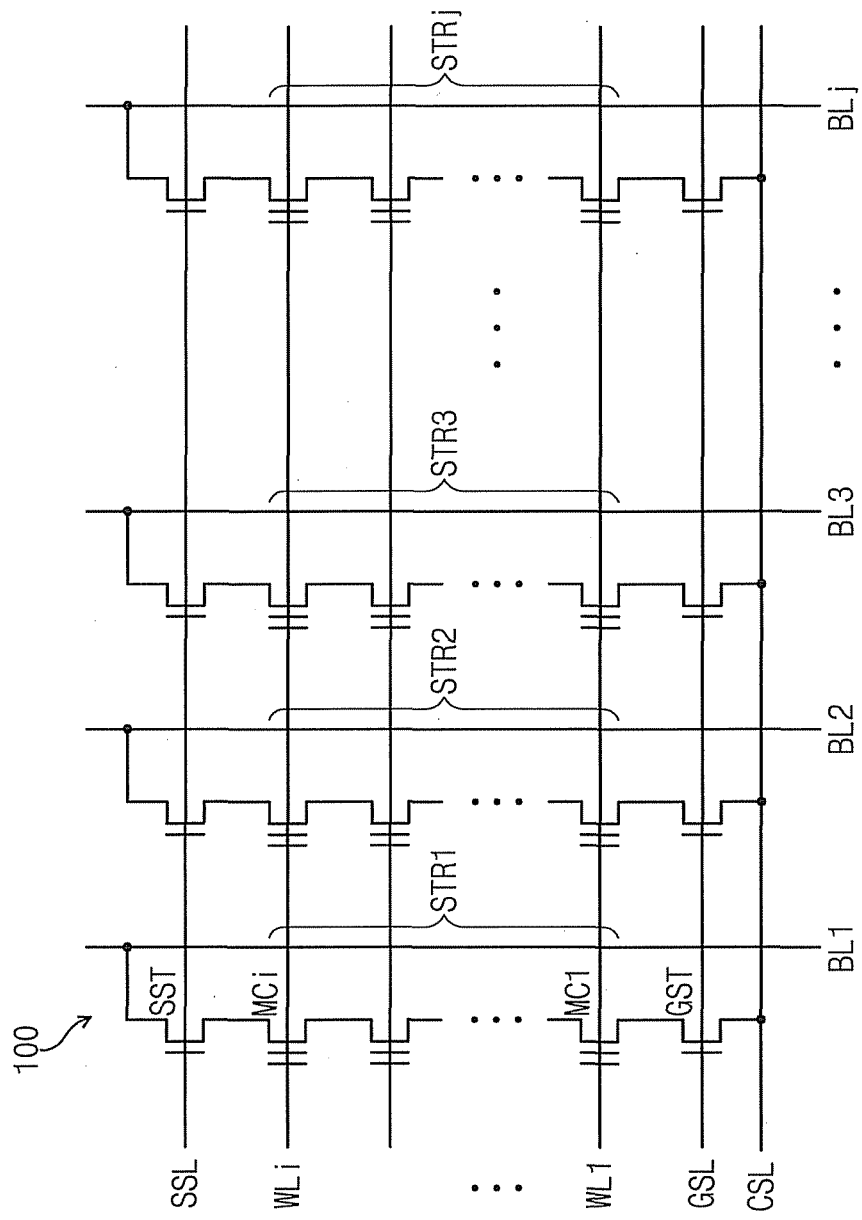
FIG. 1 is a diagram showing a part of a non-volatile memory device according to an example embodiment of the inventive concepts.

The inventive concepts are described more fully hereinafter with reference to the accompanying drawings, in which embodiments of the inventive concepts are shown. This inventive concepts may, however, be embodied in many different forms and should not be construed as limited to the embodiments set forth herein. Rather, these embodiments are provided so that this disclosure will be thorough and complete, and will fully convey the scope of the inventive concepts to those skilled in the art. In the drawings, the size and relative sizes of layers and regions may be exaggerated for clarity. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concepts.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concepts. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

The need for a high-density non-volatile memory has increased. Various techniques are proposed to satisfy such a need. One of the proposed techniques is to increase the number of data bits stored in one memory cell. Increasing the data bits stored in a memory cell or increasing in integration of memory cells may cause various interferences. One such interference may include the parasitic capacitance coupling caused between subsequently programmed memory cells. In general, the parasitic capacitance coupling may include the bit line coupling in a column direction and the word line coupling in a row direction. With the word line coupling, when a program operation on an (n+1)th word line in a programming order is executed after a program operation on an nth word line in the programming order is executed, variation of threshold voltages of memory cells connected with the (n+1)th word line causes variation of threshold voltages of memory cells connected with the nth word line, so that threshold voltage distributions of memory cells connected with the nth word line are widened. Example embodiments of the inventive concepts provide techniques for reducing the read error caused when threshold voltage distributions are widened, and will be more fully described below.

In the specification, terms "nth word line", "selected word line", "read-requested word line", etc. may be used to designate a word line associated with memory cells in which read-requested data is stored. Terms "(n+1)th programmed word line", "next programmed word line", "upper programmed word line of a read-requested word line", "upper programmed word line", etc. may be used to designate a word line associated with memory cells forcing the word line coupling to memory cells in which read-requested data is stored. This word line may not be physically adjacent or next to the read requested word line.

FIG. 1 is a diagram showing a part of a non-volatile memory device according to an example embodiment of the inventive concepts.

An embodiment in FIG. 1 shows a NAND-structured non-volatile memory. But, disclosed embodiments are not limited to this example. As illustrated in FIG. 1, a memory array 100 may include word lines WL1 to WLi and bit lines BL1 to BLj. The memory array 100 includes strings (or, NAND strings) STR1 to STRj, each of which has memory cells (or, non-volatile memory cells) MC1 to MCj. Memory cells are arranged in the word lines WL1 to WLj and the bit lines BL1 to BLj. Memory cells in each NAND string are connected in series between a string selection transistor SST and a ground selection transistor GST. The string selection transistor SST is disposed at an intersection of a bit line (for example, BL1) and a string selection line SSL, and the ground selection transistor GST is disposed at an intersection of a bit line (for example, BL1) and a ground selection line GSL.

As illustrated in FIG. 1, in each NAND string, a source of the ground selection transistor GST is connected with a common source line CSL, and a drain thereof is connected with a source of a memory cell MC1 of a corresponding NAND string (for example, STR1). A drain of the string selection transistor SST is connected with a corresponding bit line BL1, and a source thereof is connected with a memory cell MC1 of a corresponding NAND string STR1.

In some embodiments, memory cells are formed of one of various cell structures having a charge storage layer. Cell structures having a charge storage layer include a charge trap flash structure using a charge trap layer, a stack flash structure in which arrays are stacked in a multiple layer, a source-drain free flash structure, a pin-type flash structure, etc. A memory device having a charge trap flash structure as a charge storage layer is disclosed in U.S. Pat. No. 6,858,906 and U.S. Publication Nos. 2004/0169238 and 2006/0180851, the entirety of each of which is incorporated by reference herein. A source-drain free flash structure is disclosed in KR Patent No. 673020, the entirety of which is incorporated by reference herein.

In other example embodiments, memory cells can be formed of a variable resistance memory cell. An example variable resistance memory cell and a memory device including the same are disclosed in U.S. Pat. No. 7,529,124, the entirety of which is incorporated by reference herein.

Although not illustrated in FIG. 1, as will be described hereinafter and well known, the memory array 100 may be connected to various circuits (refer to FIG. 10) for read data from memory cells and writing data in memory cells.

Figure 2:
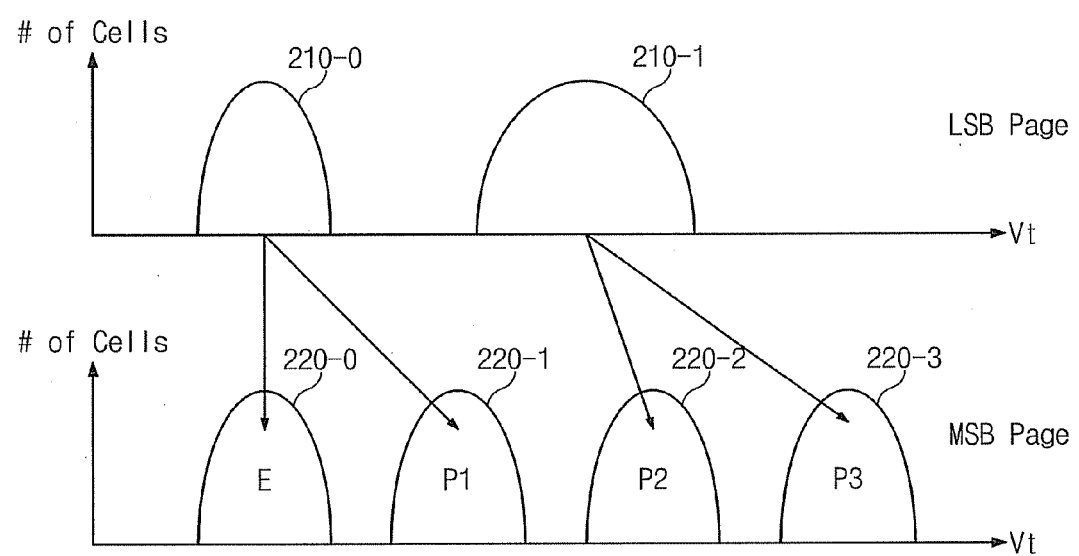
FIG. 2 is a diagram for describing a program method for reducing word line coupling.

FIG. 2 is a diagram for describing a program method for reducing the word line coupling. For ease of description, a program method for reducing the word line coupling will be described under the assumption that each memory cell stores 2-bit data formed of lower or least significant bit (LSB) data and upper or most significant bit (MSB) data. But, example embodiments of the inventive concepts are not limited to memory cells (multi-bit memory cells or multi-level memory cells) storing 2-bit data. In some embodiments, the number of data bits stored in respective multi-bit memory cells may be more or less than 2. In FIG. 2, curves 210-0 and 210-1 illustrate threshold voltage distributions for memory cells after lower page programming, and curves 220-0, 220-1, 220-2, and 220-3 illustrate threshold voltage distributions for memory cells after upper page programming.

After the LSB and MSB are programmed, as illustrated in FIG. 2, memory cells may have any one of four data states E, P1, P2, and P3. In case of a method illustrated in FIG. 2, memory cells in the threshold voltage distribution 210-0 may be programmed to a threshold voltage distribution 220-0 or a threshold voltage distribution 220-1 after the LSB programming (e.g., by a lower page programming). Memory cells in the threshold voltage distribution 210-1 may be programmed to a threshold voltage distribution 220-2 or a threshold voltage distribution 220-3 after the MSB programming (e.g., by an upper page programming). Threshold voltages of memory cells of an nth programmed word line may be shifted when a upper page is programmed at memory cells of a next word (n+1)th word line in the word line programming order. That is, threshold voltage distributions of memory cells of the nth programmed word line may widen due to the word line coupling as compared before the upper page is programmed at memory cells of the (n+1)th programmed word line. That a threshold voltage distribution widens is because memory cells of the nth programmed word line selectively experience the word line coupling when the upper page is programmed at memory cells of the (n+1)th programmed word line. It will be appreciated that that the nth and (n+1)th programmed word lines may or may not be physically adjacent.

In some embodiments, memory cells having data states P1 and P3 among memory cells of the (n+1)th programmed word line are called memory cells forcing the coupling to memory cells of the nth programmed word line, and memory cells having data states E and P2 among memory cells of the (n+1)th programmed word line are called memory cells not forcing the coupling to memory cells of the nth programmed word line. By this definition, memory cells of the nth programmed word line may be formed of coupled memory cells and uncoupled memory cells. For this reason, a threshold voltage distribution may widen. A program operation on the (n+1)th programmed word line forcing the word line coupling to memory cells of the nth programmed word line may be determined variably according to an address scramble technique.

Figure 3:
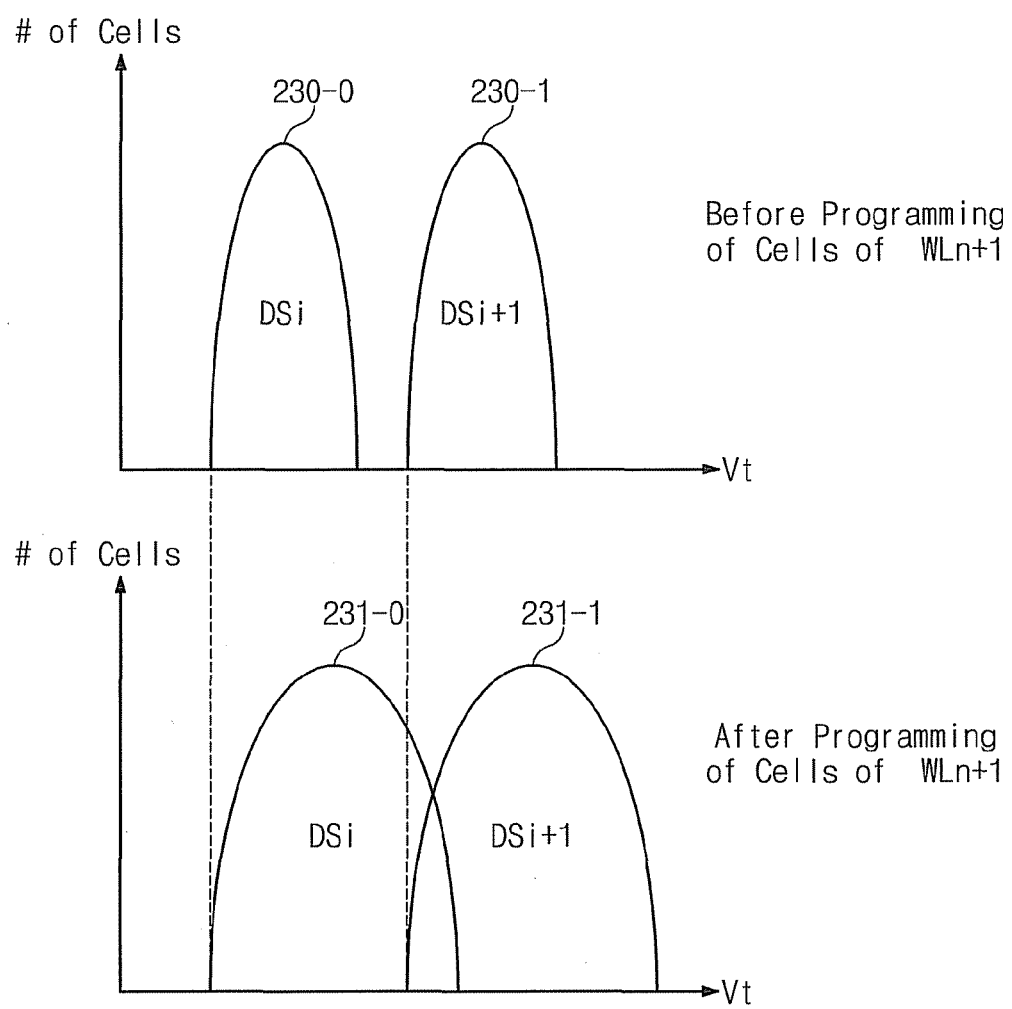
FIG. 3 is a diagram showing threshold voltage distributions associated with memory cells of an nth programmed word line before and after the word line coupling caused when memory cells of a (n+1)th programmed word line are programmed.

FIG. 3 is a diagram showing threshold voltage distributions associated with memory cells of an nth programmed word line before and after the word line coupling caused when memory cells of a (n+1)th programmed word line are programmed.

An example in FIG. 3 illustrates two adjacent threshold voltage distributions 230-0 and 230-1 associated with memory cells of an nth programmed word line before programming of memory cells of a (n+1)th programmed word line, that is, before the word line coupling. In FIG. 3, there are illustrated two threshold voltage distributions. But, it is well understood that more threshold voltage distributions are provided according to a bit number per cell. The number of threshold voltage distributions may be determined according to the number of data bits stored in a memory cell. For example, when m-bit data (m being an integer of 2 or more) is stored in a memory cell, $2^m$ threshold voltage distributions may be provided.

Threshold voltage distributions 231-0 and 231-1 illustrated in FIG. 3 show threshold voltage distributions associated with memory cells of the nth programmed word line after experiencing the word line coupling, which is caused when memory cells of the (n+1)th programmed word line are programmed. The threshold voltage distributions 231-0 and 231-1 may include threshold voltage distributions with respect to memory cells experiencing the word line coupling and memory cells not experiencing the word line coupling when memory cells of the (n+1)th programmed word line are programmed.

Figure 4:
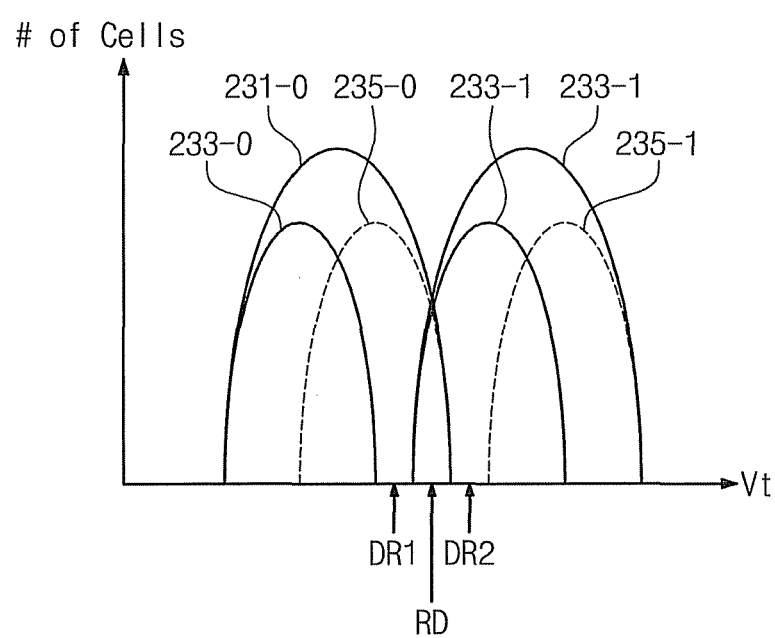
FIG. 4 is a diagram showing all threshold voltage distributions in FIG. 3 including coupled and uncoupled memory cells.

FIG. 4 is a diagram showing all threshold voltage distributions in FIG. 3 including coupled and uncoupled memory cells.

In the example of FIG. 4, threshold voltage distributions 233-0 and 233-1 illustrate threshold voltage distributions of memory cells (or, uncoupled memory cells) which do not experience a threshold voltage shift due to the word line coupling. Threshold voltage distributions 235-0 and 235-1 illustrate threshold voltage distributions of memory cells (or, coupled memory cells), which experience a threshold voltage shift due to the word line coupling. That is, the threshold voltage distributions 235-0 and 235-1 indicate a threshold voltage shift of memory cells which were programmed to data states 233-0 and 233-1.

Programmed memory cells of an nth programmed word line may belong to uncoupled threshold voltage distributions 233-0 and 233-1 or to coupled threshold voltage distributions 235-0 and 235-1, based on a threshold voltage shift caused by programming of memory cells of the (n+1)th programmed word line. As illustrated in FIG. 4, a read voltage DR1 may be used to read uncoupled memory cells, that is, to discriminate memory cells within threshold voltage distributions 233-0 and 233-1. A read voltage DR2 may be used to read coupled memory cells, that is, to discriminate memory cells within threshold voltage distributions 235-0 and 235-1.

Two read operations may be made with respect to one threshold voltage distribution (or, a data state) (formed of a coupled distribution and an uncoupled distribution) using the read voltages DR1 and DR2 in order to reduce the read error due to the word line coupling. For example, a read operation using the read voltage DR1 is made to discriminate memory cells within the uncoupled distributions 233-0 and 233-1, and a read operation using the read voltage DR2 is made to discriminate memory cells within the coupled distributions 235-0 and 235-1. Memory cells to be read using the read voltage DR1 and memory cells to be read using the read voltage DR2 may be divided according to whether memory cells of an upper word line are programmed, which will be more fully described hereinafter. As a result, a read operation on memory cells of an upper word line of the selected word line, that is, of an adjacent word line, may be made previously before read operations on memory cells of a selected word line are made. The above-described read operations are called a data recover read operation. This will be more fully described below.

Figure 5A:
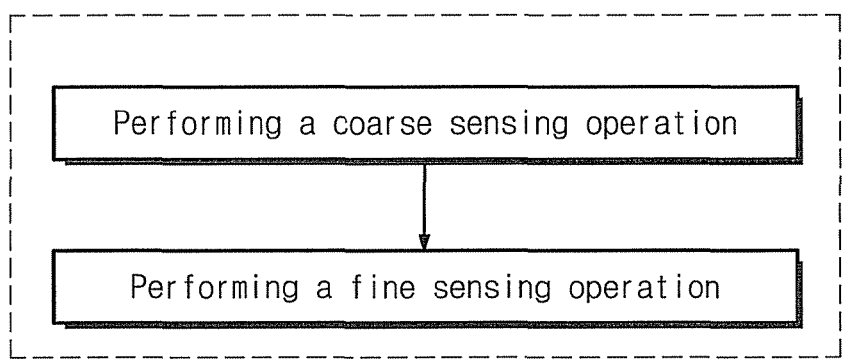
FIGS. 5A and 5B are diagrams for describing sensing techniques according to example embodiments of the inventive concepts.
Figure 5A:
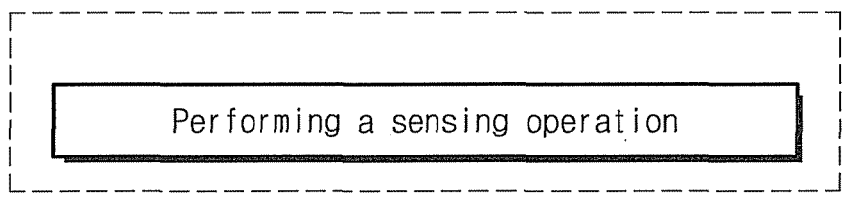
Figure 5A:
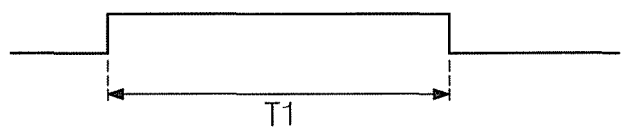
Figure 5A:
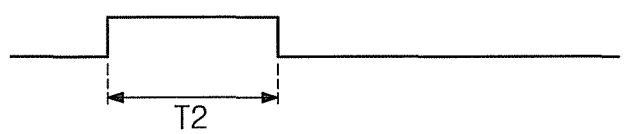
Figure 5B:
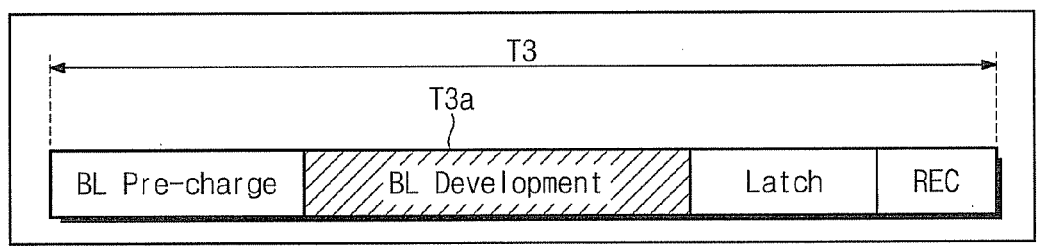
Figure 5B:
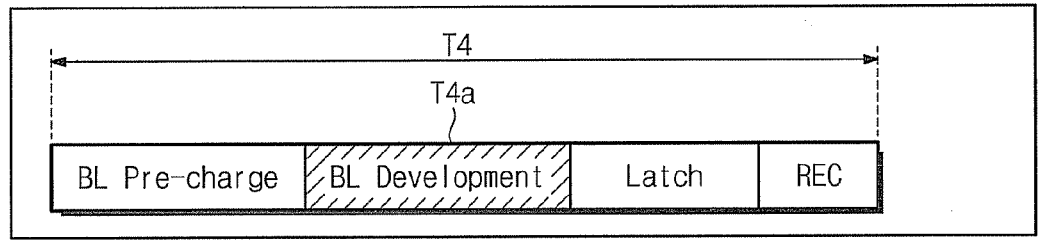

FIGS. 5A and 5B are diagrams for describing sensing techniques according to example embodiments of the inventive concepts.

A read operation according to example embodiments of the inventive concepts may be made using any one of different sensing techniques. For example, as illustrated in FIG. 5A, sensing techniques may include a normal sensing technique and an accelerated sensing technique. As a 2-step sensing technique, the normal sensing technique may include a coarse sensing operation and a fine sensing operation. Each of the coarse and fine sensing operations may include a bit line pre-charge (or, setup) interval, a bit line development interval, a latch (or sensing) interval, and a recovery interval. During the coarse sensing operation, there is judged whether each of memory cells of a selected word line is an ON cell or an OFF cell. The fine sensing operation may be made to judge ON cells of memory cells judged to be an OFF cell at the coarse sensing operation. At this time, setting-up of bit lines may be skipped with respect to memory cells judged to be an ON cell at the coarse sensing operation. That is, a bit line of a memory cell judged to be an ON cell is not pre-charged. For example, a bit line of a memory cell judged to be an ON cell is grounded. This means that a memory cell judged to be an ON cell at the coarse sensing operation continues to be maintained at an ON cell.

In an example embodiment, the coarse sensing operation and the fine sensing operation may be made sequentially with a read voltage applied to a selected word line.

As illustrated in FIG. 5A, as a 1-step sensing technique, the accelerated sensing technique may be different from the normal sensing technique at a point of view of common source line noise (hereinafter, referred to as CSL noise). The CSL noise causes ON cells to be judged as OFF cells. For this reason, ON cells can be judged as OFF cells due to the CSL noise during the coarse sensing operation. As ON cells causing the CSL noise are removed through the coarse sensing operation, memory cells erroneously judged as an OFF cell may be judged as an ON cell during the fine sensing operation. For this reason, the fine sensing operation may be made independently from the CSL noise. Accordingly, the normal sensing technique including the fine sensing operation can be defined as a CSL noise-independent (or, unaffected) sensing operation, and the accelerated sensing technique can be defined as a CSL noise-dependent (or, affected) sensing operation. That is, as illustrated in FIG. 5A, a time T2 taken to perform the CSL noise-dependent (or, affected) sensing operation is shorter than that T1 taken to perform the CSL noise-independent (or, unaffected) sensing operation.

As another embodiment, a plurality of sensing techniques may be classified on the basis of a time (that is, a bit line develop time) taken to develop a bit line pre-charge voltage. As illustrated in FIG. 5B, a bit line development time T4$a$ on a upper word line of a read-requested word line during accelerated sensing may be set shorter than the development time T3$a$ on the read-requested word line during normal sensing. Here "upper word line" means the word line following the read-requested word line in a word line programming order. Accordingly, as illustrated in FIG. 5B, a time T4 taken to perform the CSL noise-dependent sensing operation is shorter than a time T3 taken to perform the CSL noise-independent sensing operation. As a result, the read operation including the CSL noise-independent sensing operation is shorter than the read operating including the CSL noise-independent sensing operation. A sensing technique where a development time becomes relatively short may undergo the CSL noise. That is, the sensing technique where a development time becomes relatively shorter may be the CSL noise-dependent sensing technique. On the other hand, a sensing technique where a development time becomes relatively longer may be a sensing technique not undergoing the CSL noise, that is, the CSL noise-independent sensing technique.

Although not shown in figures, a read operation on an upper word line of a read-requested word line can be made using a coarse sensing operation and a fine sensing operation. In this case, it is possible to reduce a read time for the upper word line by reducing a time taken to perform any one of the time intervals (for example, a bit line pre-charge interval, a bit line development interval, a latch interval, etc.) of each of the coarse and fine sensing operations.

Figure 6A:
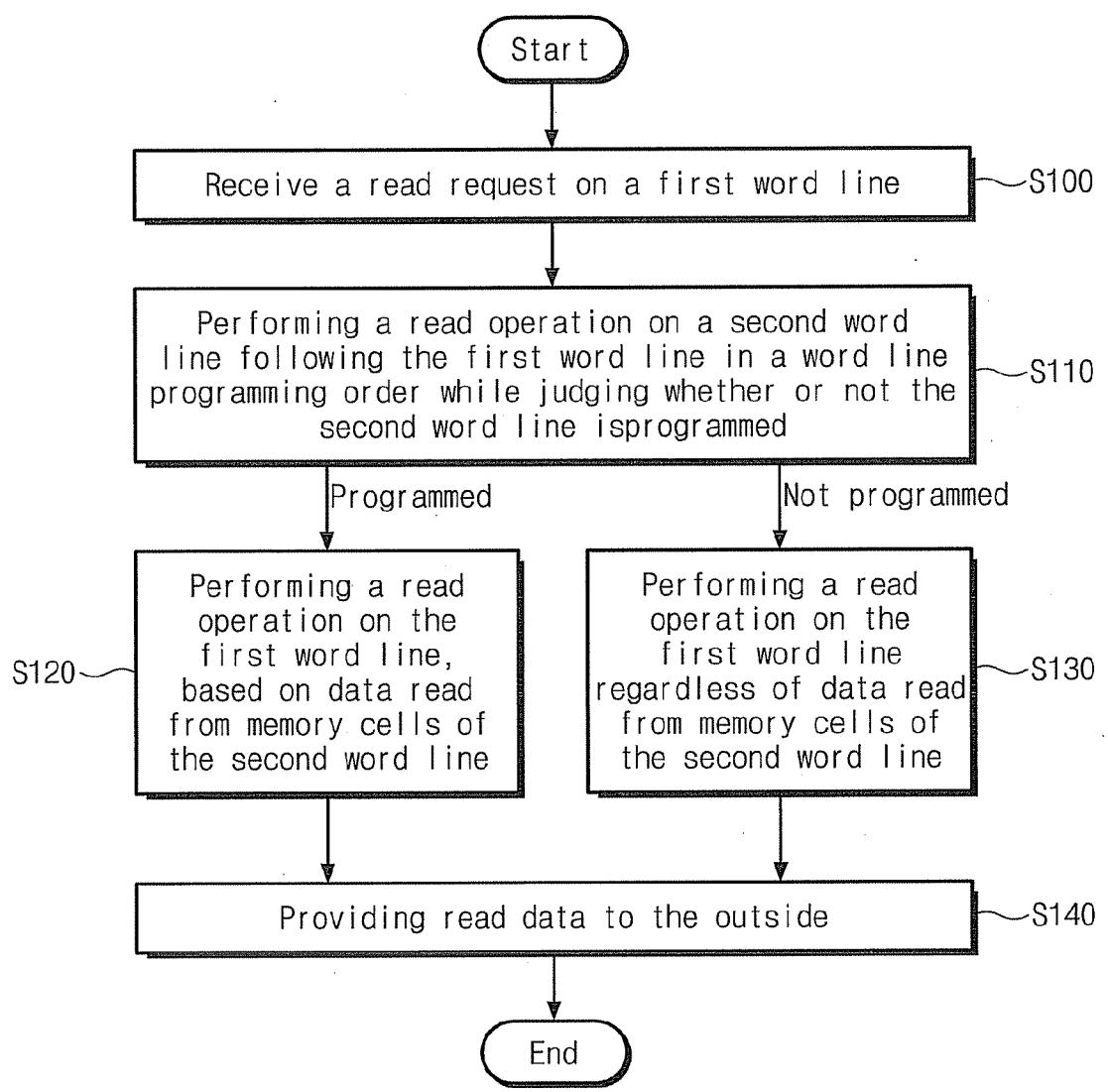
FIG. 6A is a flow chart for describing a read method of a non-volatile memory device according to an example embodiment of the inventive concepts.
Figure 6B:
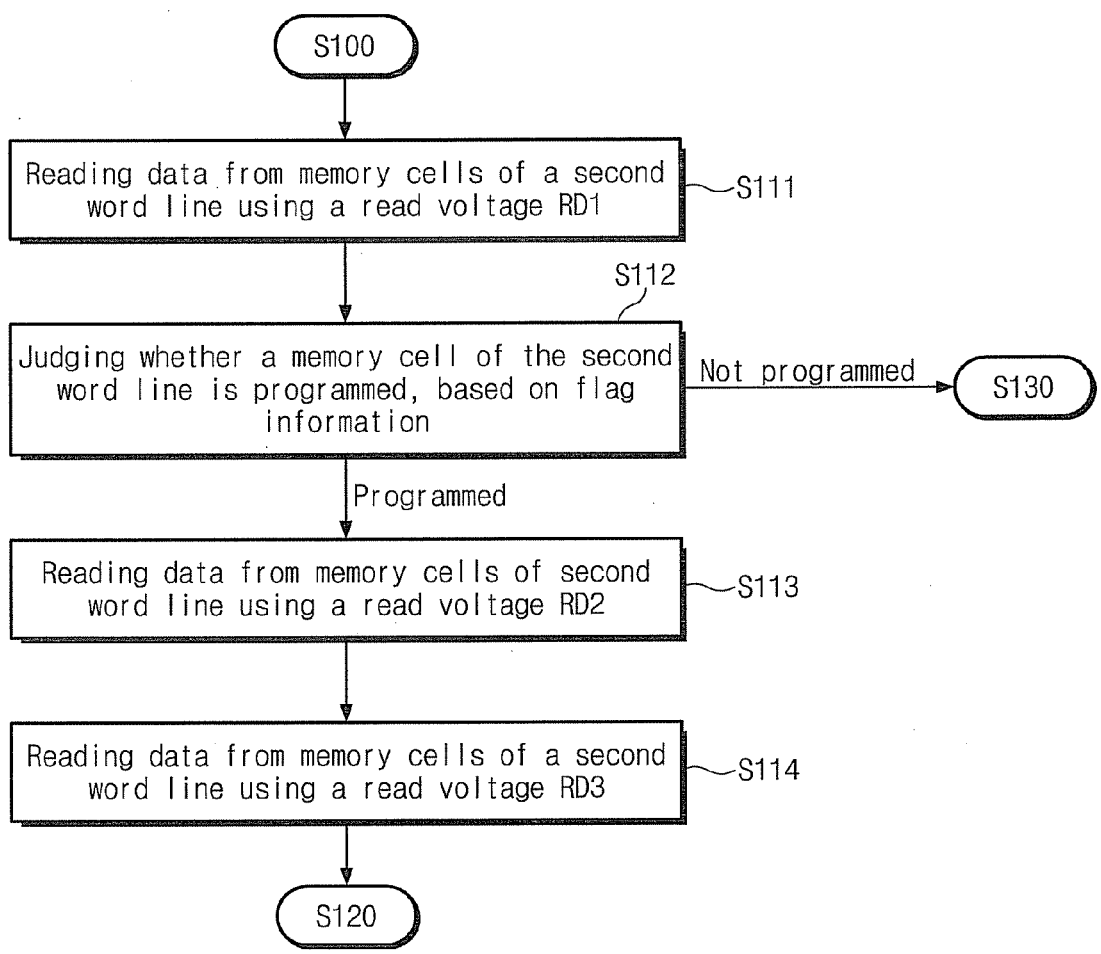
FIG. 6B is a flow chart for describing a step S110 in FIG. 6A.
Figure 7A:
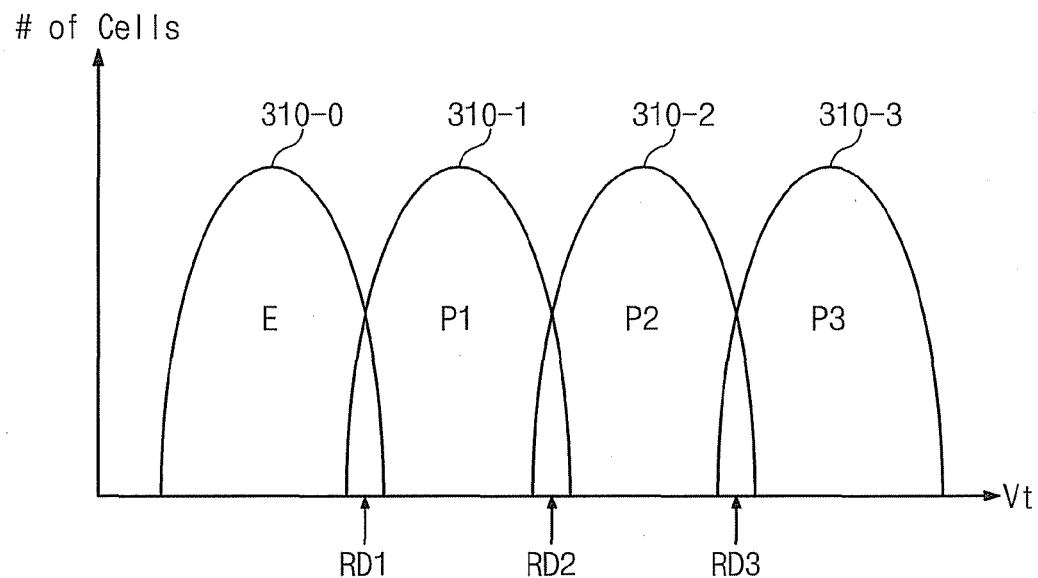
FIG. 7A is a diagram for describing a read operation on the second word line described in FIGS. 6A and 6B.
Figure 7B:
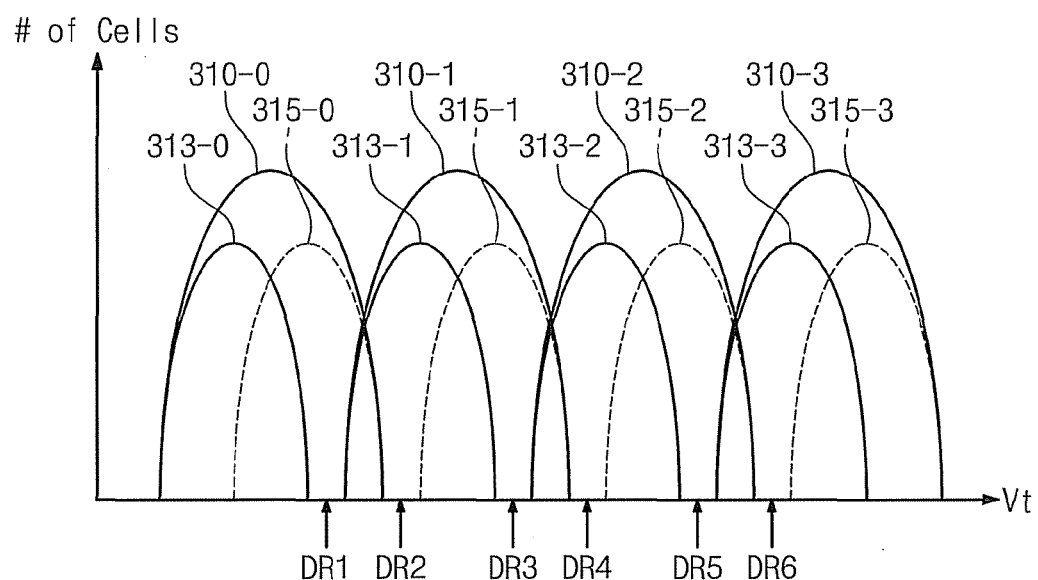
FIG. 7B is a diagram for describing a read operation on the first word line described in FIG. 6A.

FIG. 6A is a flow chart for describing a read method of a non-volatile memory device according to an example embodiment of the inventive concepts, and FIG. 6B is a flow chart for describing a step S110 in FIG. 6A. FIG. 7A is a diagram for describing a read operation on the second word line described in FIGS. 6A and 6B, and FIG. 7B is a diagram for describing a read operation on the first word line described in FIG. 6A. Below, a read method of a non-volatile memory device according to an example embodiment of the inventive concepts will be more fully described with reference to accompanying drawings.

First of all, referring to FIG. 6A, in step S100, a read request on the first word line may be received. In step S110, a read operation is performed on the second word line following the first word line in a word line programming order in response to the read request. At the same time, there may be judged whether the second word line (that is, at least one memory cell of the second word line) is programmed. As discussed above, the second word line may cause word line coupling to memory cells of the first word line. A read operation on the second word line, for example, may be made according to an accelerated sensing technique described in FIGS. 5A and 5B. A read operation on the second word line will be more fully described with reference to FIGS. 6B and 7A.

Referring to FIGS. 6B and 7A, in step S111, data states may be read from memory cells of the second word line, with a read voltage RD1 applied to the second word line. At this time, data states of memory cells judged as an ON cell may be an erase state E corresponding to a threshold voltage distribution 310-0. In step S112, whether memory cells of the second word line are programmed may be judged according to a part of data read via a read operation, which is made using the read voltage RD1. Alternatively, a data state of a flag cell connected with the second word line may instead be read at the read operation on the second word line. Whether memory cells of the second word line are programmed may be judged, based on a data state of the flag cell. The flag may be programmed if at least one memory cell in the second word line is programmed.

If in step S112 memory cells of the second word line are programmed, as illustrated in FIG. 6B, the procedure goes to step S113, in which data states are read from memory cells of the second word line. For example, assuming step S112 was performed by reading memory cells of the second word line using the read voltage RD1, then a read voltage RD2 is applied to the second word line. Otherwise, reading using RD1 and RD2 may be performed. During each operation, a sensing operation on memory cells judged as an ON cell at a previous read operation may be prohibited. This may be accomplished by grounding bit lines of memory cells judged as an ON cell at a previous read operation. This means that a sensing operation is made with respect to memory cells judged as an OFF cell at a previous read operation. Data states of memory cells, which are judged as an ON cell at a read operation made using the read voltage RD2, may be a program state P1 corresponding to a threshold voltage distribution 310-1.

Finally, in step S114, data states may be read from memory cells of the second word line, with a read voltage RD3 applied to the second word line. Likewise, a sensing operation may be prohibited with respect to memory cells judged to be an ON cell at previous read operations made using the read voltages RD1 and RD2. This may be accomplished by grounding bit lines of memory cells judged to be an ON cell at the previous read operations. Data states of memory cells, which are judged as an ON cell at a read operation made using the read voltage RD3, may be a program state P2 corresponding to a threshold voltage distribution 310-2. Data states of memory cells, which are judged as an OFF cell at a read operation made using the read voltage RD3, may be a program state P3 corresponding to a threshold voltage distribution 310-3.

Returning to step S112, if the data state of the memory cells of the second word line are not programmed, the procedure goes to step S130. In other words, if the data state of the memory cells of the second word line are not programmed, as illustrated in FIG. 6B, the above-described steps S113 and S114 may be skipped.

As described in FIG. 2, memory cells having the data states P1 and P3 may be defined as memory cells causing the word line coupling, and memory cells having the data states E and P2 may be defined as memory cells not causing the word line coupling. For example, page buffers connected with respective bit lines may include latches which are set to '1' or '0' according to a result of a read operation on the second word line. Latches of page buffers corresponding to memory cells having the data states P1 and P3 may be set to '0' (or, '1'), while latches of page buffers corresponding to memory cells having the data states E and P2 may be set to '1' (or, '0').

Returning to FIG. 6A, when memory cells of the second word line are judged to be programmed, that is, after read operations are executed using the read voltages RD1, RD2, and RD3, the procedure goes to step S120. In step S120, a read operation may be made with respect to uncoupled memory cells (that is, memory cells not experiencing the word line coupling) and with respect to coupled memory cells (that is, memory cells experiencing the word line coupling), respectively. This will be more fully described with reference to FIG. 7B.

As described above and illustrated in FIG. 7B, each of threshold voltage distributions 310-0, 310-1, 310-2, and 310-3 may include a distribution of uncoupled memory cells and a distribution of coupled memory cells. For example, the threshold voltage distribution 310-0 may include a distribution 313-0 of uncoupled memory cells and a distribution 315-0 of coupled memory cells. The threshold voltage distribution 310-1 may include a distribution 313-1 of uncoupled memory cells and a distribution 315-1 of coupled memory cells. The threshold voltage distribution 310-2 may include a distribution 313-2 of uncoupled memory cells and a distribution 315-2 of coupled memory cells. The threshold voltage distribution 310-3 may include a distribution 313-3 of uncoupled memory cells and a distribution 315-3 of coupled memory cells.

A read order may be determined according to whether a read operation is associated with a lower page (or least significant bit) or an upper page (or most significant bit) and according to a bit ordering. It is assumed that one memory cell stores 2-bit data and that a bit ordering of '11', '01', '00', and '10' is used. With this assumption, a lower page may be read via read operations using read voltages DR3 and DR4, and an upper page may be read via read operations using read voltages DR1 and DR2 and via read operations using read voltages DR5 and DR6. It is well understood that the bit ordering is not limited to this disclosure. For ease of description, it is assumed that a read operation on a lower page is requested. In this case, firstly, a read operation using the read voltage DR3 may be made to discriminate memory cells in the threshold voltage distributions 313-1 and 313-2, and then a read operation using the read voltage DR4 may be made to discriminate memory cells in the threshold voltage distributions 315-1 and 315-2. The read operations using the read voltages DR3 and DR4 may be made via a normal sensing technique described in FIG. 5A or 5B. In another embodiment, a read operation using the read voltage DR3 may be made via the normal sensing technique, while a read operation using the read voltage DR4 may be made via an accelerated sensing technique described in FIG. 5A or 5B. Since most memory cells of the first word line are judged to be an ON cell via the read voltage DR3 (that is, the read operation using the DR3), the read operation using the read voltage DR4 may be made to be independent from the CSL noise.

The read operation using the read voltage DR3 may be made with respect to a part (that is, uncoupled memory cells) of memory cells of the first word line, and the read operation using the read voltage DR4 may be made with respect to the other (that is, coupled memory cells) memory cells of the first word line. Accordingly, the duration of the reading/sensing operation performed on a memory cell of the second word line is less than the duration of the sensing/reading operation on uncoupled memory cells of the first word line and may be the same duration as for coupled memory cells of the first word line. The uncoupled memory cells and the coupled memory cells may be divided according to a result of a read operation made in the step S110. That is, the uncoupled memory cells and the coupled memory cells may be divided according to values stored in latches of page buffers corresponding to memory cells of the first word line. While the read voltage DR3 is being applied to the first word line, bit lines of the coupled memory cells may be set to a ground voltage according to values of corresponding latches. While the read voltage DR4 is being applied to the first word line, bit lines of the uncoupled memory cells may be set to a ground voltage according to values of corresponding latches. Afterwards, the procedure goes to step S140, in which data read in the step S120 may be provided to an external device.

Returning to step S110, when memory cells of the second word line are judged not to be programmed, that is, after read operations using the read voltages RD2 and RD3 are skipped, the procedure goes to step S130. In step S130, a read operation on the first word line may be executed. The read operation on the first word line may be made via the normal sensing technique described in FIG. 5A or 5B. At this time, the read voltage DR3 may be applied to the first word line at a read operation executed in step S130. That is, when read operations of the second word line using the read voltages RD2 and RD3 are skipped, in step S130, a read operation of the first word line may be made using read voltages (for example, DR1, DR3, or DR5) for discriminating data states of uncoupled memory cells. In another embodiment, in step S130, a read voltage RD2 can be used to judge data states of memory cells of the first word line. This is because memory cells of the second word line are not programmed. Afterwards, the procedure goes to step S140, in which data read in step S130 may be provided to an external device.

As described above, a read operation on memory cells of the second word line may be made via a CSL noise-dependent sensing technique, which has a read time relatively shorter than that of a CSL noise-independent sensing technique. The number of error bits, which are included in data read from memory cells of the second word line via the CSL noise-dependent sensing technique, may increase as compared with the number of error bits included in data read from memory cells of the second word line via the CSL noise-independent sensing technique. Memory cells judged as an error bit due to the CSL noise-dependent sensing technique may exist at a tail or end of a threshold voltage distribution. But, memory cells existing at the tail or end of the threshold voltage distribution are less. In other words, if memory cells erroneously read at a read operation on the second word line do not exist at an end of a threshold voltage distribution, the memory cells do not cause a read error. This will be more fully described blow.

In an example embodiment, it is possible to perform a read operation using read voltages RD1, RD2, and RD3, without prohibition of a sensing operation on memory cells judged to be an ON cell at a previous operation.

Figure 8:
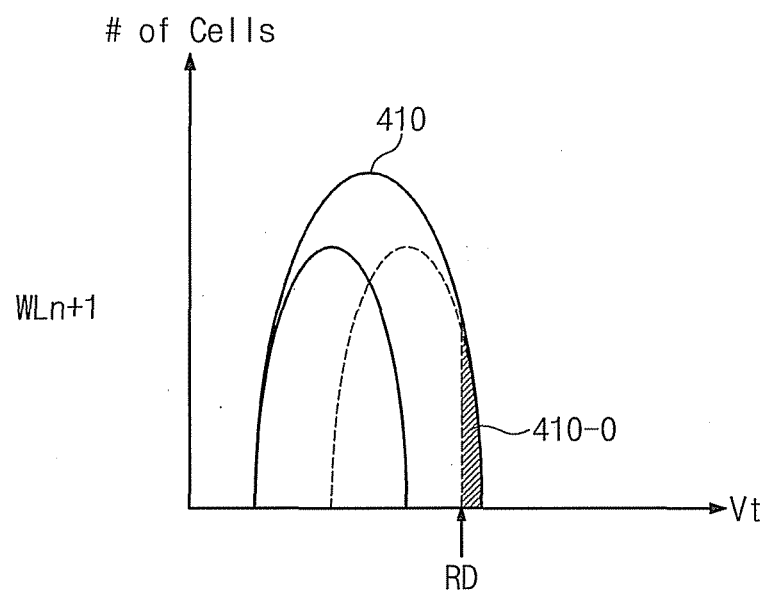
FIG. 8 is a diagram showing the probability that erroneously read memory cells of a word line following a selected word line in a word line programming order are judged to be errors at a read operation on the selected word line.
Figure 8:
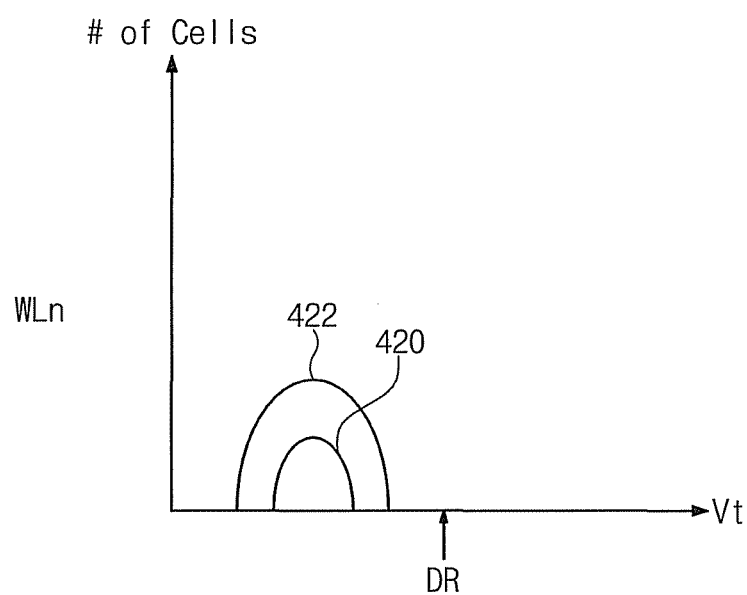

FIG. 8 is a diagram showing the probability that erroneously read memory cells of a word line following a selected word line in a word line programming order are judged to be errors at a read operation on the selected word line.

Referring to FIG. 8, when a read operation on the second word line (in word line programming order) is made using a CSL noise-dependent sensing technique instead of a CSL noise-independent sensing technique, memory cells in a shaded portion 410-0 of a threshold voltage distribution 410 may be judged to be errors. This may increase the probability that memory cells judged to be errors are judged to be errors at a read operation on the first word line. For example, a distribution 420 indicates the probability that memory cells, judged to be errors at a read operation on the second word line using the CSL noise-independent sensing technique, are judged to be errors at a read operation on the first word line. A distribution 422 indicates the probability that memory cells, judged to be errors at a read operation on the second word line using the CSL noise-dependent sensing technique, are judged to be errors at a read operation on the first word line. As illustrated in FIG. 8, although the error probability increases to a curve 422 from a curve 420, there exists no probability that memory cells in a shaded portion 410-0 of a threshold voltage distribution 410 are read to be errors, that is, to be an OFF cell on the basis of a read voltage DR applied to the first word line. In addition, since data read from memory cells of the second word line are not read-requested data, errors included in data read from memory cells of the second word line do not affect errors of the read-requested data.

Figure 9:
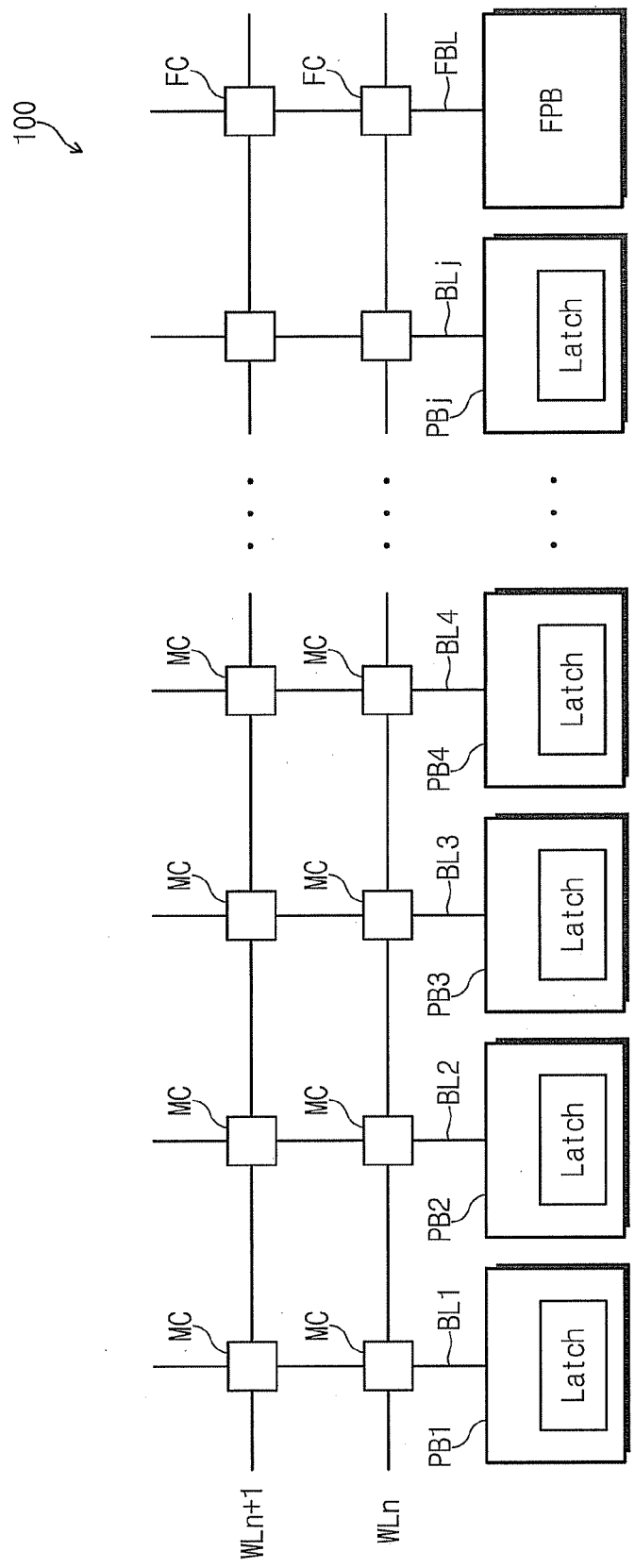
FIG. 9 is a diagram for describing an operation of classifying coupled memory cells and uncoupled memory cells.

FIG. 9 is a diagram for describing an operation of classifying coupled memory cells and uncoupled memory cells.

Referring to FIG. 9, page buffers PB1 to PBj may be connected with bit lines BL1 to BLj of a memory array 100, respectively. The respective page buffers PB1 to PBj may include a latch for storing a value indicating whether a memory cell of a word line WLn+1, following a read-requested word line WLn in the word line programming order, is a memory cell causing the coupling. For example, as a result of a read operation made in a step S110 of FIGS. 6A and 6B, latches of page buffers corresponding to memory cells having data states P1 and P3 may be set to '0' (or, '1'), and latches of page buffers corresponding to memory cells having data states E and P2 may be set to '1' (or, '0'). A page buffer (for example, PB1) including a latch set to '0' (or, '1') may set a corresponding bit line BL1 at a DR1 read operation executed in a step S120 of FIG. 6A to a ground voltage. A page buffer (for example, PB2) including a latch set to '1' (or, '0') may set a corresponding bit line BL2 at a DR2 read operation executed in a step S120 of FIG. 6A to a ground voltage. Memory cells of a read-requested word line WLn may be divided into coupled memory cells and uncoupled memory cells, based on values of latches of page buffers PB1 to PBj.

As illustrated in FIG. 9, flag cells FC may be connected with word lines WLn and WLn+1, respectively. Each of the flag cells FC may store flag information indicating whether memory cells MC of a corresponding word line are programmed. A page buffer FPB is connected with a bit line FBL connected with the flag cells FC. In an example embodiment, the flag cell FC may store flag information indicating whether upper page programming (e.g., most significant bit programming) is made with respect to a corresponding word line.

The page buffer PB1 to PBj illustrated in FIG. 9 may be configured to constantly maintain pre-charge voltages of bit lines during a sensing operation. In this case, voltages of internal nodes (for example, known as a sensing node) of the page buffers may vary, and voltage variations of the internal nodes may be sensed. The bit line architecture illustrated in FIG. 9 may be the all bit line architecture. But, it is well understood that the inventive concepts are applied to the even-odd bit line architecture. With the even-odd bit line architecture, one page buffer is shared by two bit lines. One of two bit lines may be connected with a page buffer.

Figure 10:
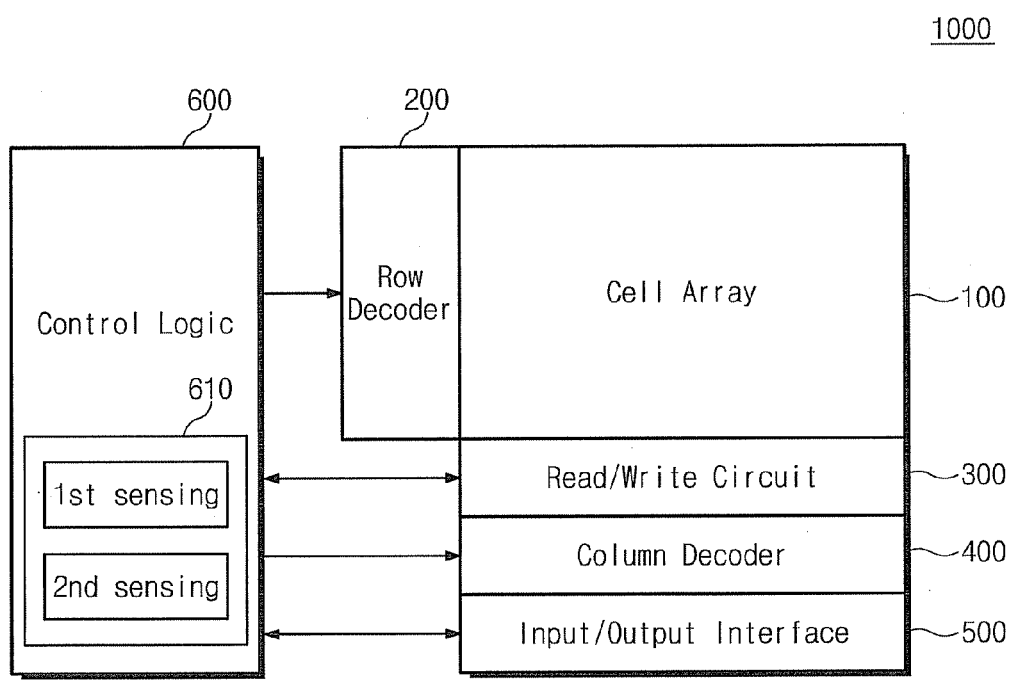
FIG. 10 is a block diagram showing a non-volatile memory device to which a read method according to an example embodiment of the inventive concepts is applied.

FIG. 10 is a block diagram showing a non-volatile memory device to which a read method according to an example embodiment of the inventive concepts are applied.

Referring to FIG. 10, a non-volatile memory device may include a cell array 100, a row decoder circuit 200, a read/write circuit 300, a column decoder circuit 400, an input/output interface 500, and control logic 600. The cell array 100 may be configured identical to that in FIG. 1, and description thereof is thus omitted. The row decoder circuit 200 may perform selecting and driving of rows of the cell array 100 in response to the control of the control logic 600. The read/write circuit 300 may operate as a read circuit, which performs a sensing operation with respect to the cell array 100 in response to the control of the control logic 600. Further, the read/write circuit 300 may operate as a write circuit, which performs a write operation with respect to the cell array 100 in response to the control of the control logic 600. The read/write circuit 300 may be formed of page buffers PB1 to PBj and FPB described in FIG. 9. The column decoder circuit 400 may operate responsive to the control of the control logic 600 to select columns of the cell array 100, that is, page buffers of the read/write circuit 300. The input/output interface 500 may provide an interface with an external device (for example, a memory controller or a host).

The control logic 600 may be configured to control an overall operation of the non-volatile memory device 1000. In particular, the control logic 600 may include a read scheduler 610 configured to control a read operation using a plurality of sensing techniques. For example, the read scheduler 610 of the control logic 600 may control a read operation such that a read time on a word line following a read-requested word line in the word line programming order is shorter than a read time on the read-requested word line. The read time on the read-requested word line is determined according to the first sensing technique being a normal sensing technique (for example, a CSL noise-independent sensing technique) described in FIG. 5A or 5B. The read time on the word line following the read-requested word line is determined according to the second sensing technique being an accelerated sensing technique (for example, a CSL noise-dependent sensing technique) described in FIG. 5A or 5B. In this case, the read time on the word line following the read-requested word line may be shorter than the read time on the read-requested word line.

In an example embodiment, memory cells having data states P1 and P3 are defined as memory cells causing the word line coupling, and memory cells having data states E and P2 are defined as memory cells not causing the word line coupling. But, memory cells having data states P1, P2, and P3 can be defined as memory cells causing the word line coupling, and memory cells having a data state E can be defined as memory cells not causing the word line coupling. In this case, a read operation is once executed using a read voltage between data states E and P1, and memory cells of a read-requested word line may be divided into coupled memory cells and uncoupled memory cells according to a result of a read operation which is executed once.

Figure 11:
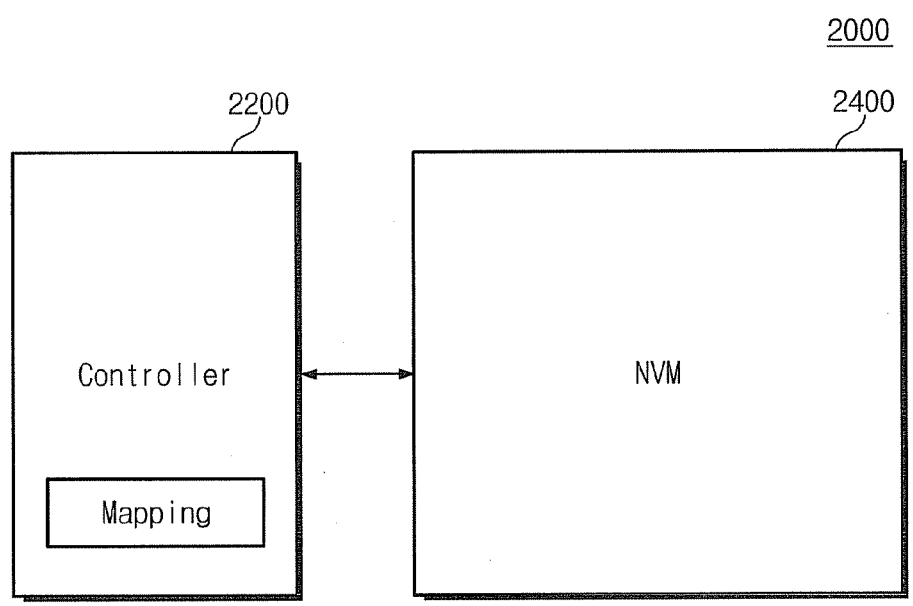
FIG. 11 is a block diagram for describing a read method according to another example embodiment of the inventive concepts.

FIG. 11 is a block diagram for describing a read method according to another example embodiment of the inventive concepts.

Referring to FIG. 11, a memory system 2000 may include a memory controller 2200 and a non-volatile memory device 2400. The memory controller 2200 may be configured to control the non-volatile memory device 2400. In particular, the memory controller 2200 may manage mapping information of the non-volatile memory device 2400. The mapping information may include information indicating whether word lines (or, pages) of the non-volatile memory device 2400 are programmed. When a read request is received from an external device (for example, a host), the memory controller 2400 may judge whether there is provided a word line ("upper word line") following a read-requested word line in the word line programming order for which the requested data is stored. The memory controller 2400 may control the non-volatile memory device 2400 so as to perform a read operation accompanying a read operation of an upper word line or a read operation not accompanying a read operation of an upper word line, based on the judgment result. The non-volatile memory device 2400 may perform a read operation not accompanying a read operation of an upper word line or a read operation accompanying a read operation of an upper word line in response to the control of the memory controller 2200. That is, the non-volatile memory device 2400 does not judge whether memory cells of the upper word line are programmed. The non-volatile memory device 2400 in FIG. 11 may operate to be identical to a read method described in FIGS. 1 to 9 except for the above-described difference.

Figure 12A:
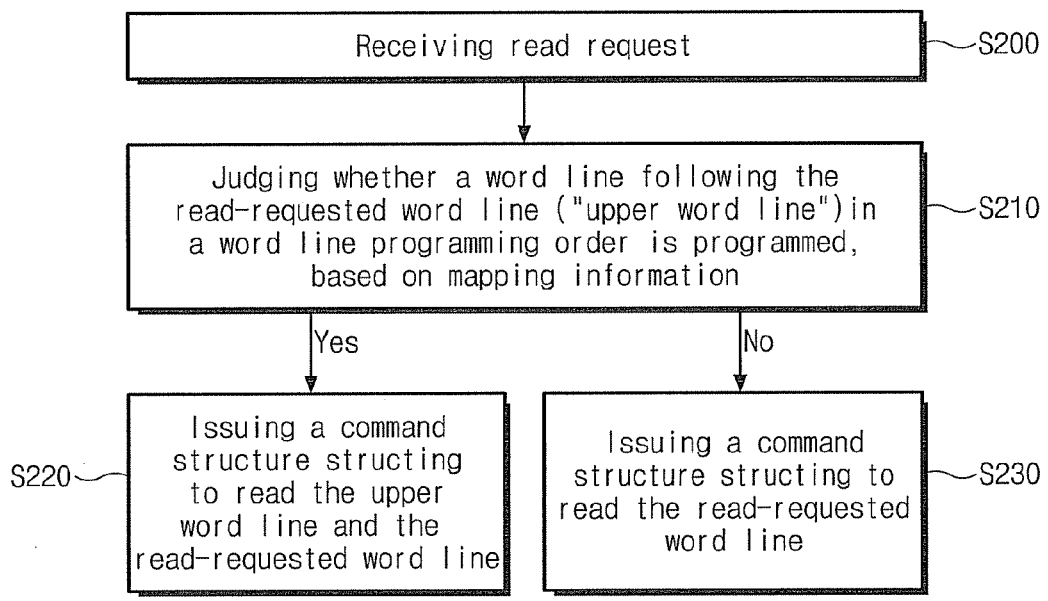
FIG. 12A is a flow chart for describing an operation of a memory controller in FIG. 11.
Figure 12B:
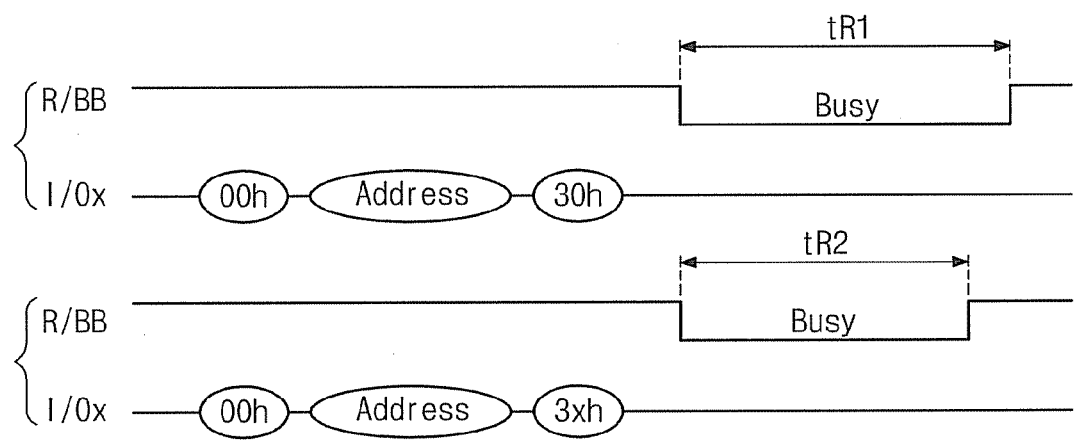
FIG. 12B is a diagram showing different read commands generated by a memory controller in FIG. 11.

FIG. 12A is a flow chart for describing an operation of a memory controller in FIG. 11, and FIG. 12B is a diagram showing different read commands generated by a memory controller in FIG. 11.

Referring to FIG. 12A, a memory controller 2200 may be configured to receive a read request (S200); to judge whether a word line ("upper word line") following a read-requested word line in a word line programming order includes a programmed memory cell, based on mapping information (S210); to generate a command structure instructing to perform a read operation on the upper word line and a read operation on the read-requested word line when the upper word line is judged to be programmed (S220); and to generate a command structure instructing to perform a read operation on the read-requested word line (and not the upper word line) if the upper word line is judged not to be programmed (S230). For example, step S220 may be directed via a set of a command 00h, an address, and a command 30h. On the other hand, step S230 may be directed via a set of a command 00h, an address, and a command 3xh.

Figure 13:
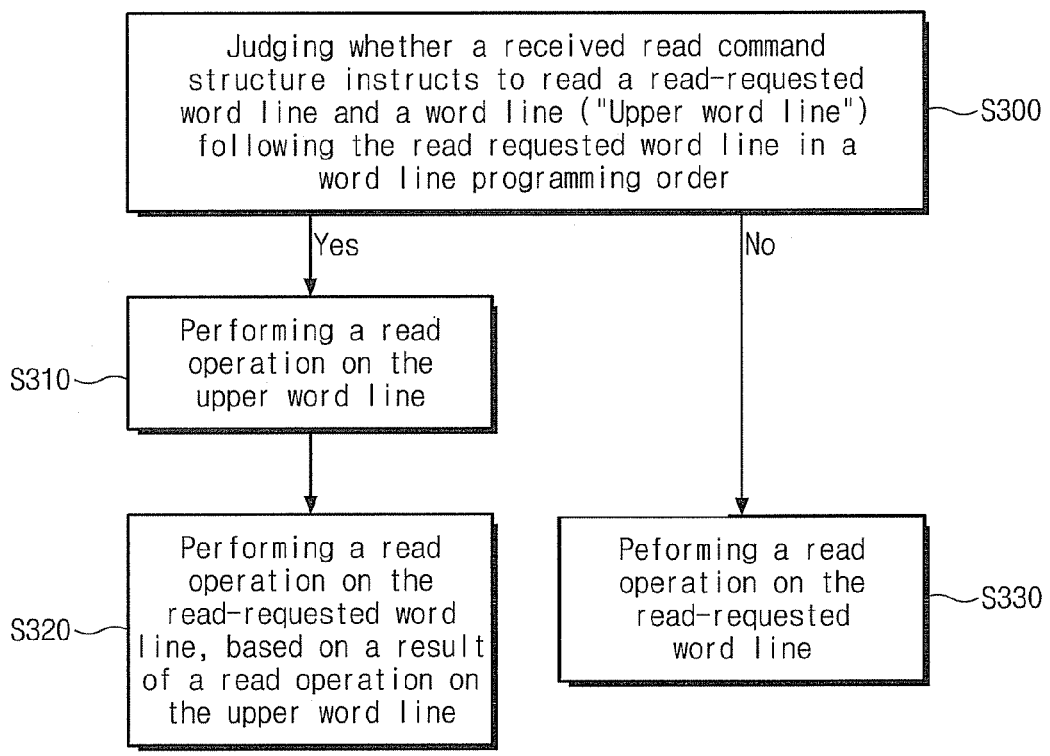
FIG. 13 is a flow chart for describing an operation of a non-volatile memory device in FIG. 11.

FIG. 13 is a flow chart for describing an operation of a non-volatile memory device in FIG. 11.

Referring to FIG. 13, a non-volatile memory device 2400 may be configured to judge whether an input command structure instructs to perform a read operation on an upper word line and read-request word line (S300); to perform a read operation on the upper word line (S310) and to perform a read operation on the read-requested word line, based on a result of a read operation on the upper word line (S320) if the command structure is affirmatively judged in step S300; and to perform a read operation on the read-requested word line when the command structure is negatively judged in step S300 (S330). A read operation in the step S310 may be made via an accelerated sensing technique described in FIG. 5A or 5B. A read operation in the step S310 may be executed identically to that described in a step S110 of FIG. 6 except that there is skipped an operation for judging whether the adjacent word line is programmed. A read operation in the step S320 may be made via a normal sensing technique described in FIG. 5A or 5B. A read operation in the step S310 may be executed identically to that described in a step S120 of FIG. 6. A read operation in the step S330 may be executed identically to that described in a step S130 of FIG. 6.

Figure 14:
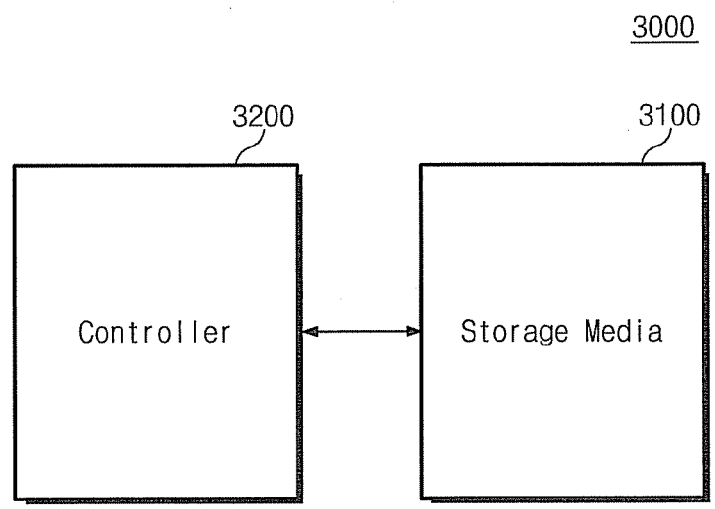
FIG. 14 is a block diagram showing a data storage device including a non-volatile memory device according to an example embodiment of the inventive concepts.

FIG. 14 is a block diagram showing a data storage device including a non-volatile memory device according to an example embodiment of the inventive concepts.

Referring to FIG. 14, a data storage device 3000 may include a storage media 3100 and a controller 3200. The storage media 3100 may be used to store data information having various data types such as text, graphic, software code, etc. The storage media 3100 may be formed of a non-volatile memory device described in FIG. 10, and description thereof is thus omitted. The controller 3200 may be configured to control the storage media 3100 in response to an external request.

Figure 15:
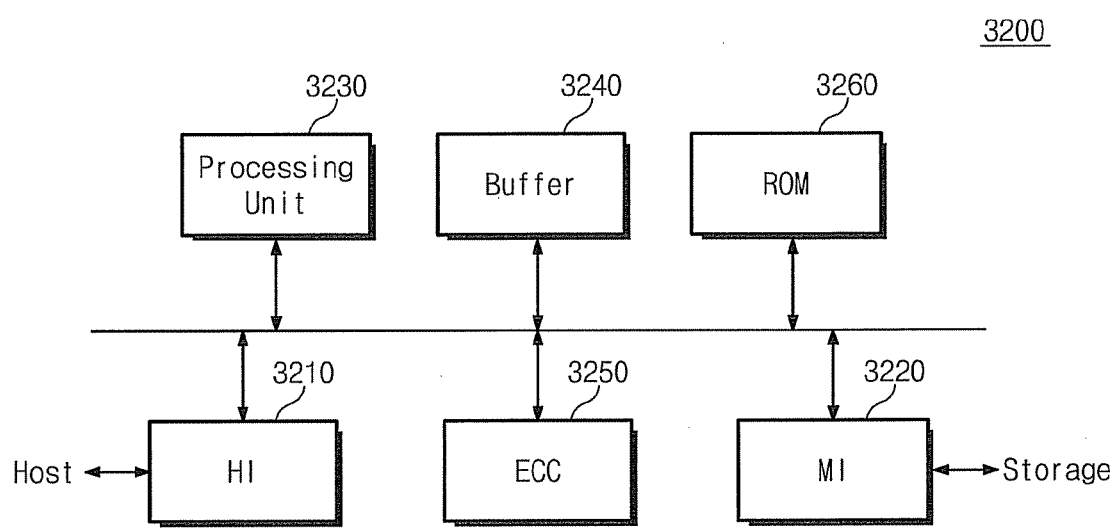
FIG. 15 is a block diagram showing a controller in FIG. 14 according to an example embodiment of the inventive concepts.

FIG. 15 is a block diagram showing a controller in FIG. 14 according to an example embodiment of the inventive concepts. Referring to FIG. 15, a controller 3200 according to an example embodiment of the inventive concepts may include the first interface 3210, the second interface 3220, a processing unit 3230, a buffer 3240, an ECC unit 3250, and ROM 3260.

The first interface 3210 may be configured to interface with an external device (or, a host). The second interface 3220 may be configured to interface with a storage media 3100 illustrated in FIG. 14. For example, the processing unit 3230, for example, a CPU, may be configured to operate firmware such as a Flash Translation Layer (FTL). The buffer 3240 may be used to temporarily store data transferred from the external device via the first interface 3210. The buffer 3240 may be used to temporarily store data transferred from the storage media 3100 via the second interface 3220. The ECC unit 3250 may be configured to encode data to be stored in the storage media 3100 and to decode data read out from the storage media 3100.

Figure 16:
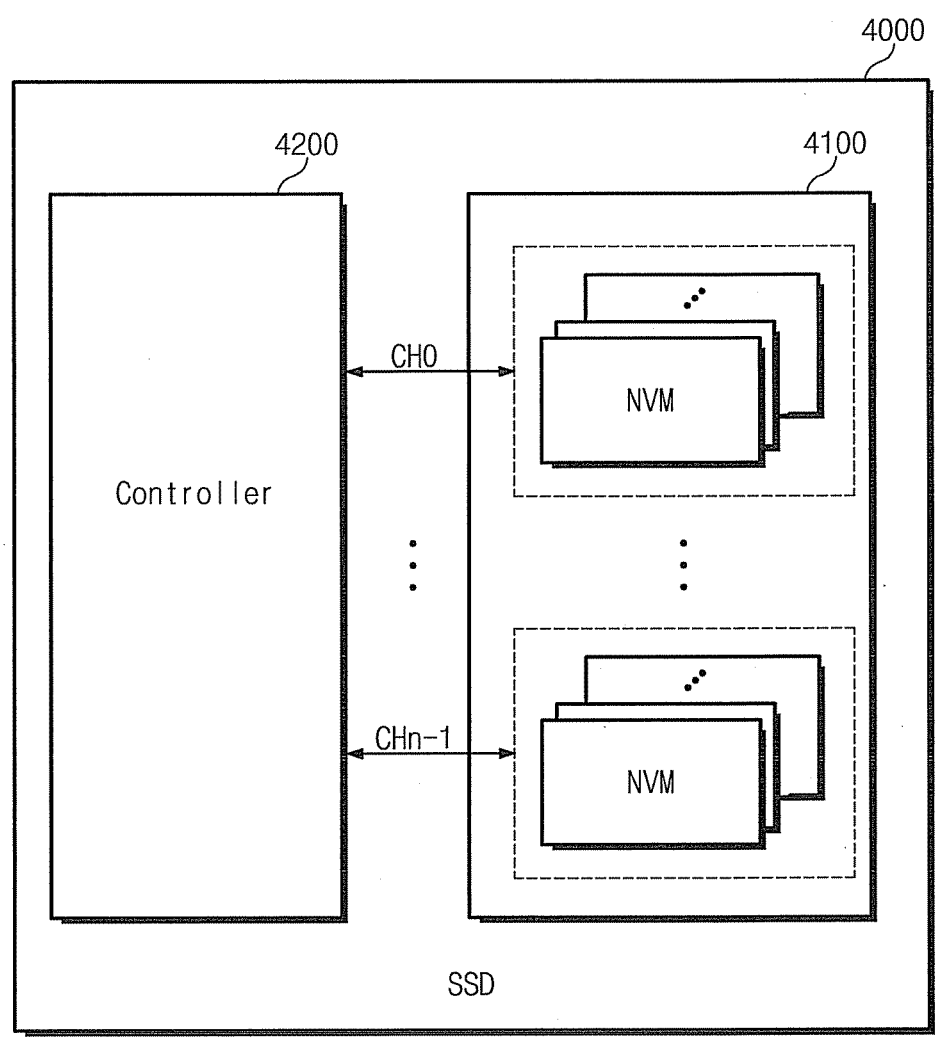
FIG. 16 is a block diagram showing a solid state drive using a non-volatile memory device according to example embodiments of the inventive concepts.

FIG. 16 is a block diagram showing a solid state drive using a non-volatile memory device according to example embodiments of the inventive concepts.

Referring to FIG. 16, a solid state drive (SSD) 4000 may comprise a storage media 4100 and a controller 4200. The storage media 4100 is connected with the controller 4200 via a plurality of channels, each of which is commonly connected with a plurality of non-volatile memories. Each non-volatile memory device may be formed of a memory described in FIG. 10. The controller 4200 may be configured to control the storage media 4100.

Figure 17:
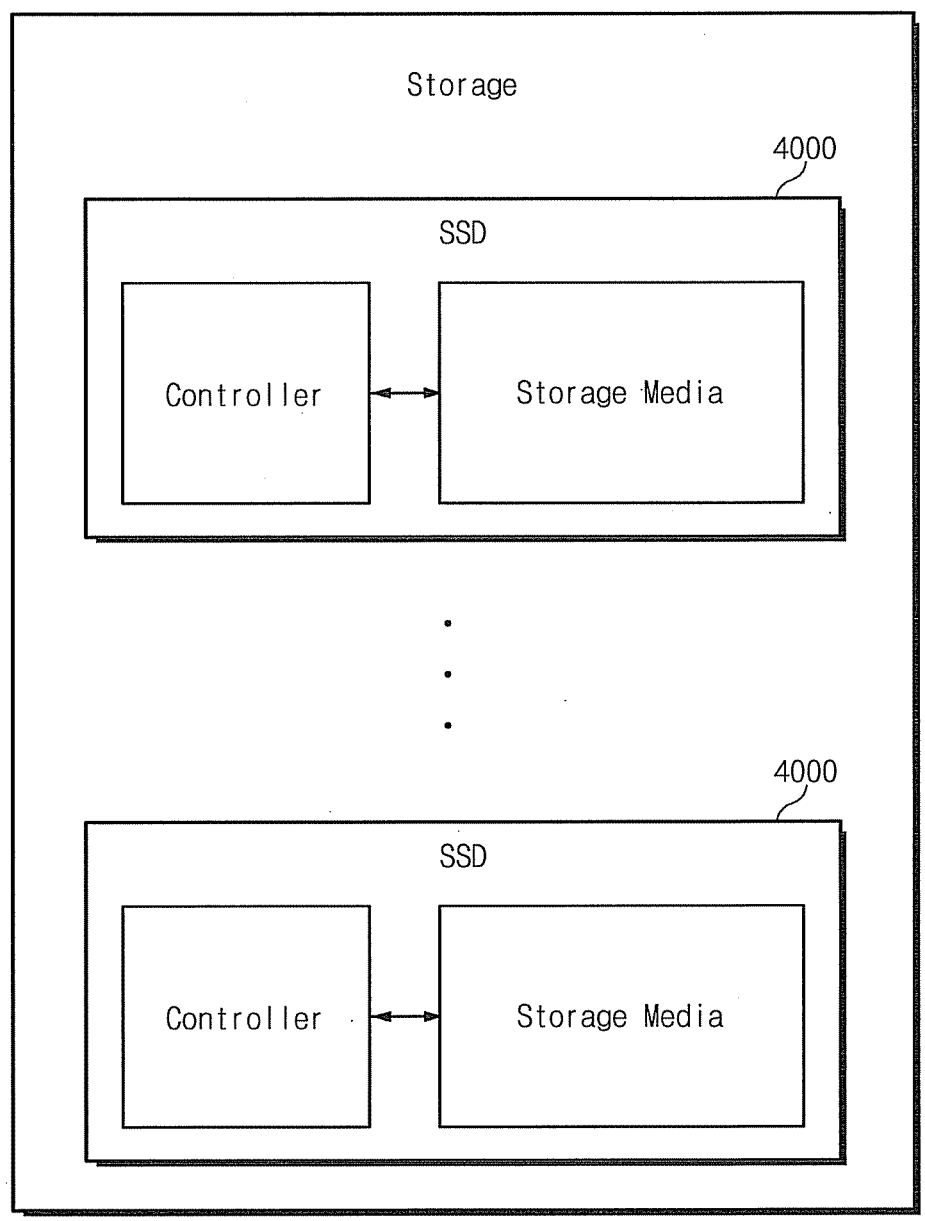
FIG. 17 is a block diagram showing a storage using a solid state drive in FIG. 16.
Figure 18:
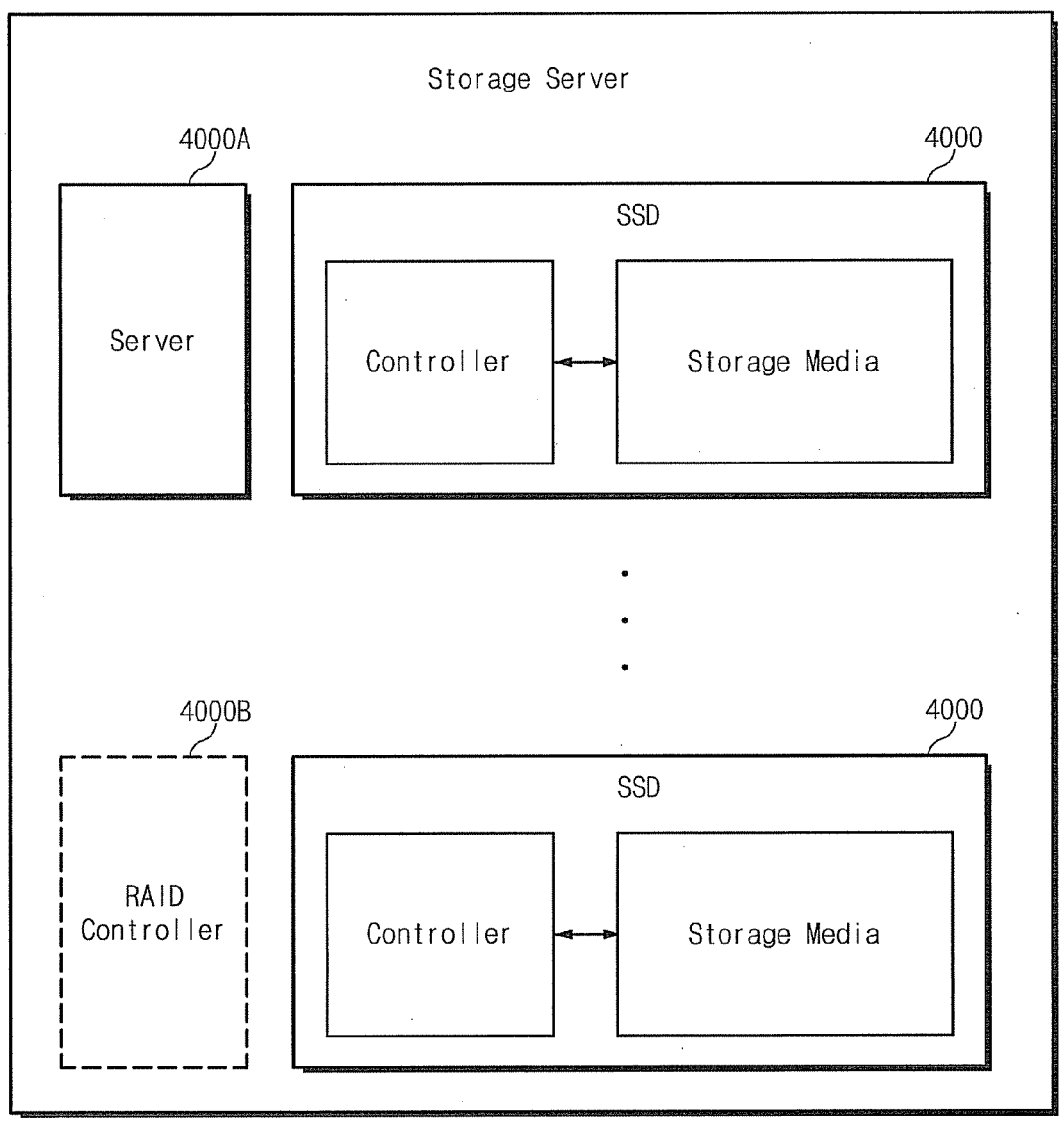
FIG. 18 is a block diagram showing a storage server using a solid state drive in FIG. 16.

FIG. 17 is a block diagram showing a storage using a solid state drive in FIG. 16, and FIG. 18 is a block diagram showing a storage server using a solid state drive in FIG. 16.

An SSD 4000 according to an example embodiment of the inventive concepts may be used to form the storage. As illustrated in FIG. 17, the storage includes a plurality of solid state drives 4000 which are configured the same as described in FIG. 16. An SSD 4000 according to an example embodiment of the inventive concepts is used to configure a storage sever. As illustrated in FIG. 18, a storage server includes a plurality of solid state drives 4000, which are configured the same as described in FIG. 16, and a server 4000A. Further, it is well comprehended that a well-known RAID controller 4000B is provided in the storage server.

Figure 19:
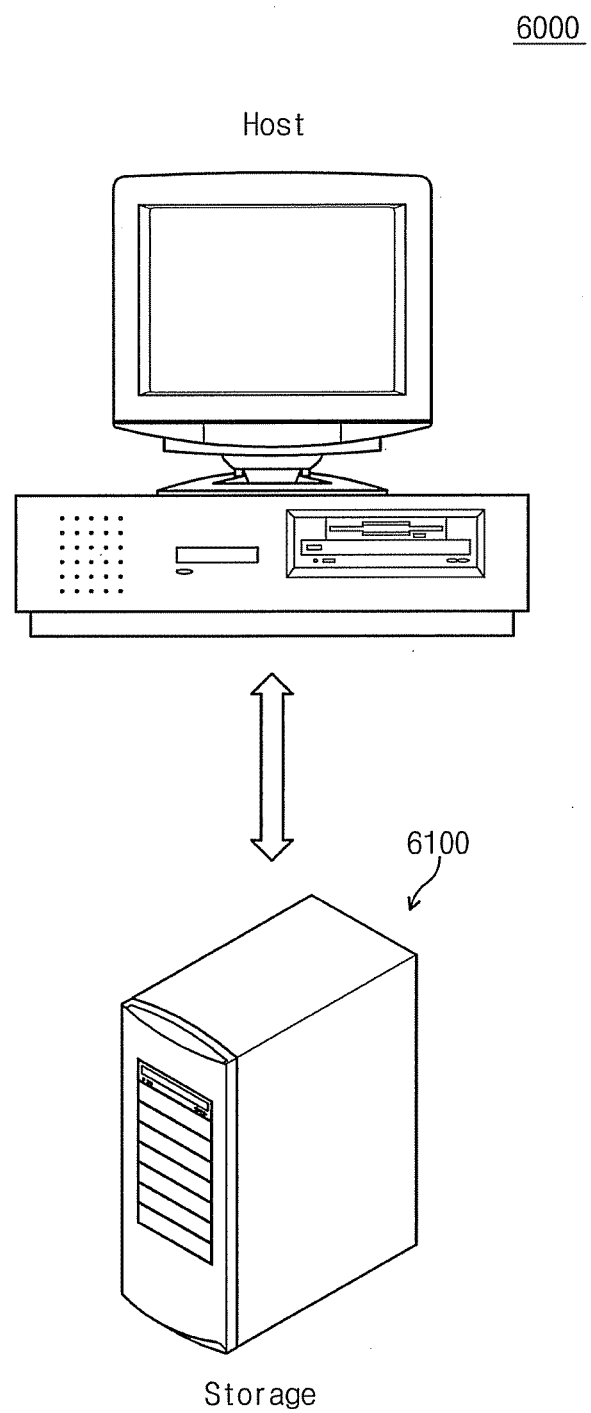
FIGS. 19 to 26 are diagrams showing systems according to example embodiments of the inventive concepts.
Figure 20:
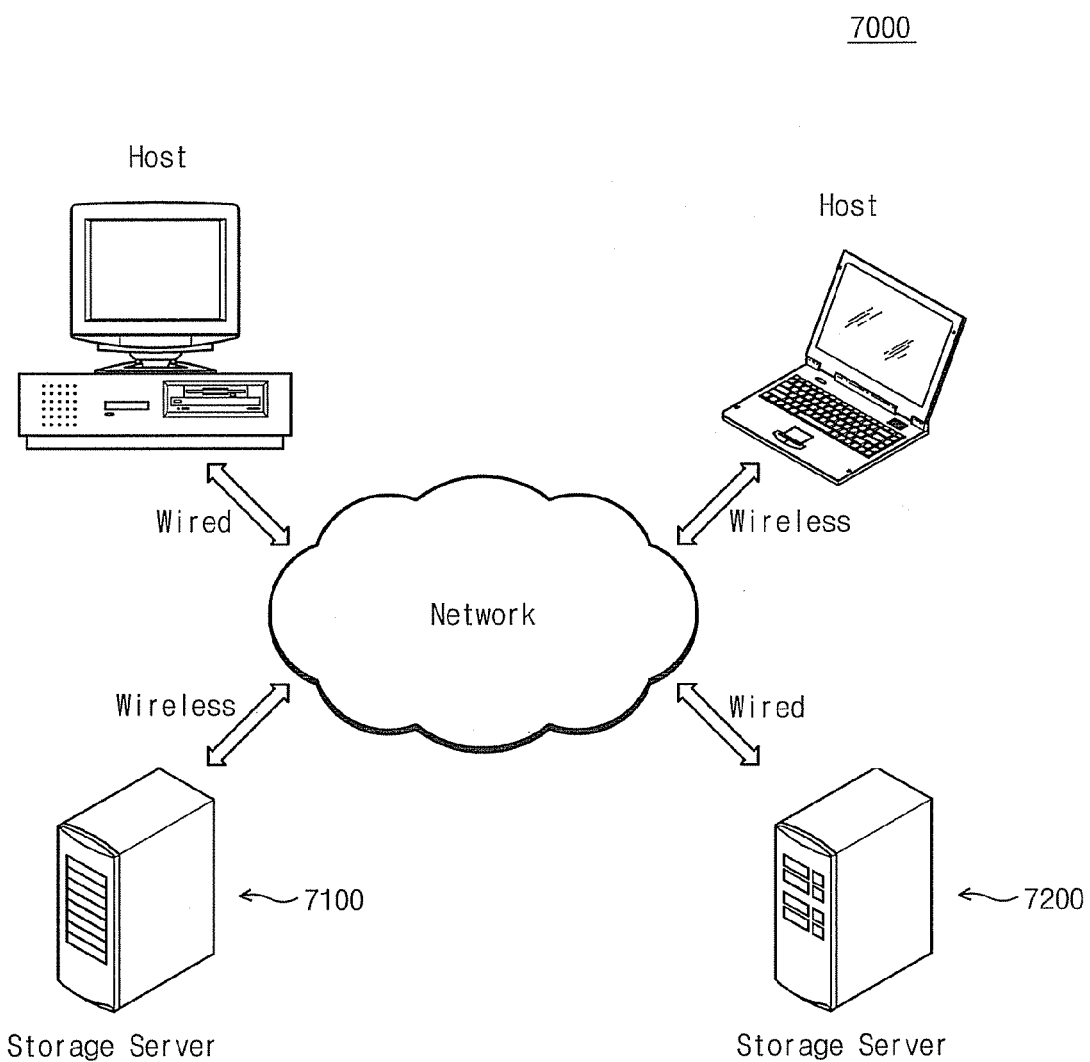
Figure 21:
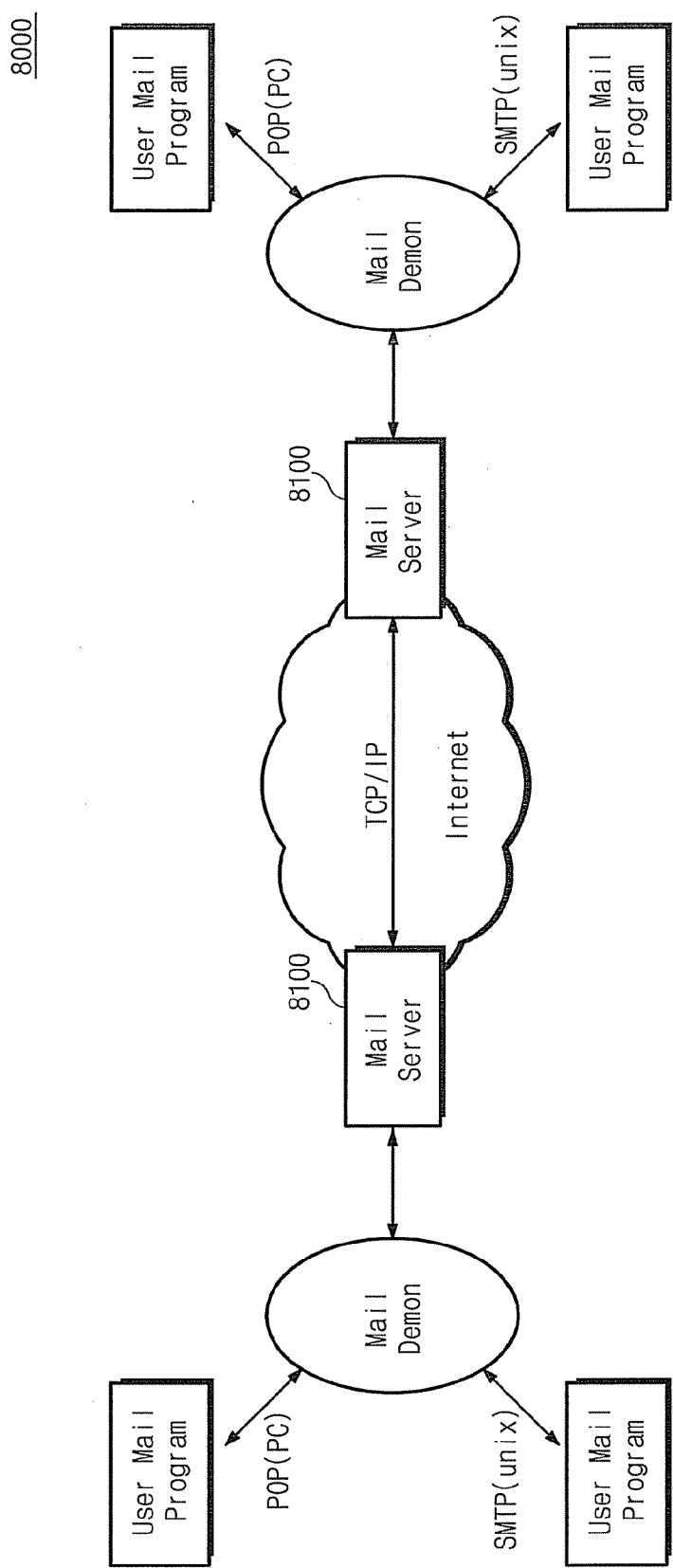

FIGS. 19 to 21 are diagrams showing systems to which a data storage device according to example embodiments of the inventive concepts is applied.

In the event that a solid state drive including a data storage device according to example embodiments of the inventive concepts is applied to the storage, as illustrated in FIG. 19, a system 6000 includes a storage 6100 which communicates with a host by a wire or wireless manner. In a case where a solid state drive including a data storage device according to example embodiments of the inventive concepts is applied to a storage server, as illustrated in FIG. 20, a system 7000 includes a storage servers 7100 and 7200 which communicate with a host by a wire or wireless manner. Further, as illustrated in FIG. 21, a solid state drive including a data storage device according to example embodiments of the inventive concepts can be applied to a mail server 8100.

FIGS. 22 to 26 are diagrams showing other systems to which a data storage device according to example embodiments of the inventive concepts is applied.

Figure 22:
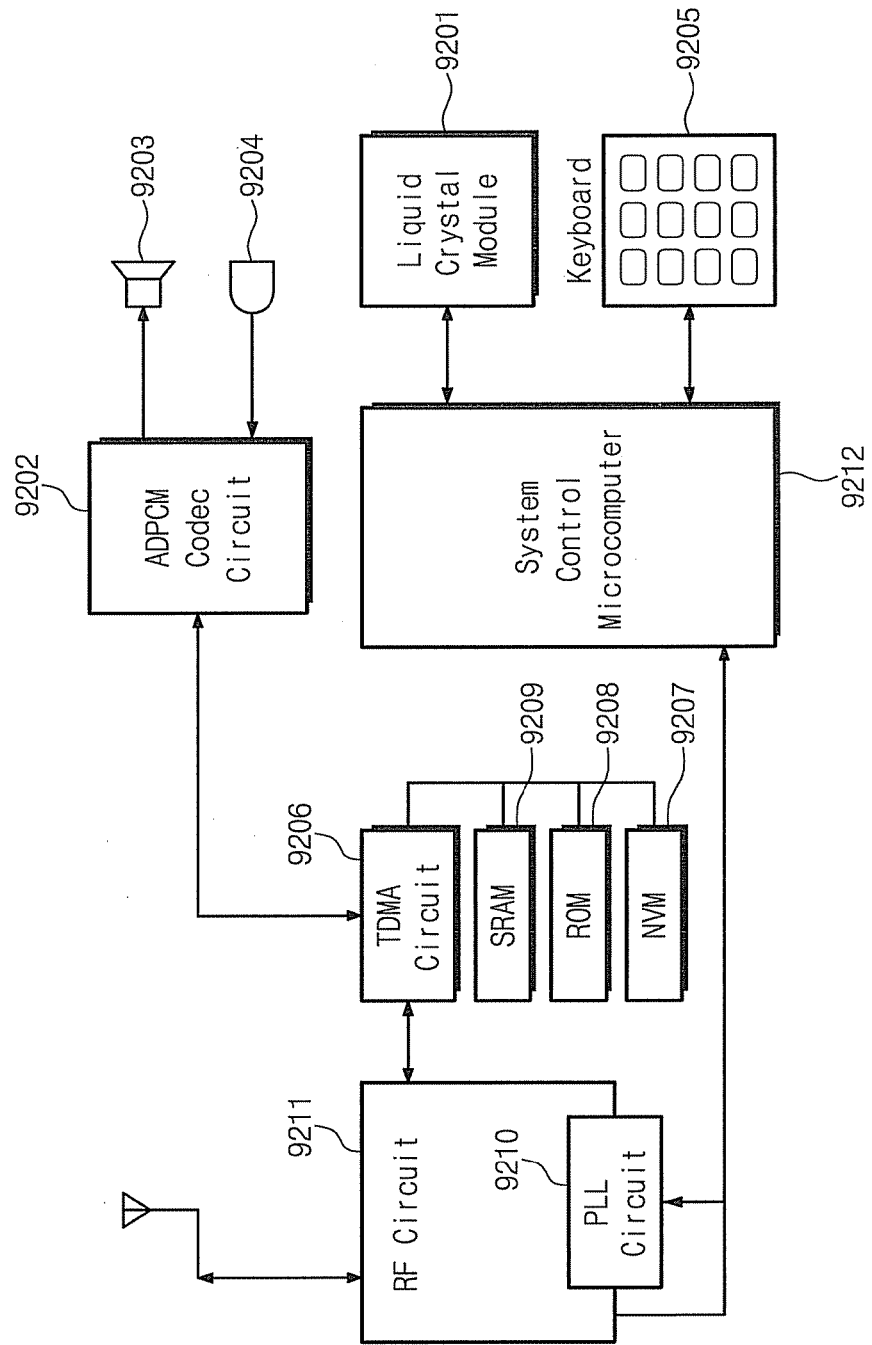

FIG. 22 is a block diagram illustrating a cellular phone system according to an example embodiment of the inventive concepts.

Referring to FIG. 22, a cellular phone system may include an ADPCM codec circuit 9202 for compressing a voice and decompressing a compressed voice, a speaker 9203, a microphone 9204, a TDMA circuit 9206 for time-division multiplexing digital data, a PLL circuit 9210 configured to set a carrier frequency of a radio frequency signal, an RF circuit 9211 configured to send and receive a radio frequency signal, and the like.

Further, the cellular phone system may include various types of memories, such as the non-volatile memory device 9207, the ROM 9208, and the SRAM 9209. The non-volatile memory device 9207 may be formed of a non-volatile memory device according to embodiments of the inventive concepts. The ROM 9208 may be used to store programs, and the SRAM 9209 may be used as a work region for the system control microcomputer 9212 or/and to temporarily store data. Herein, the system control microcomputer 9212 is a processor configured to control write and read operations of the non-volatile memory device 9207.

Figure 23:
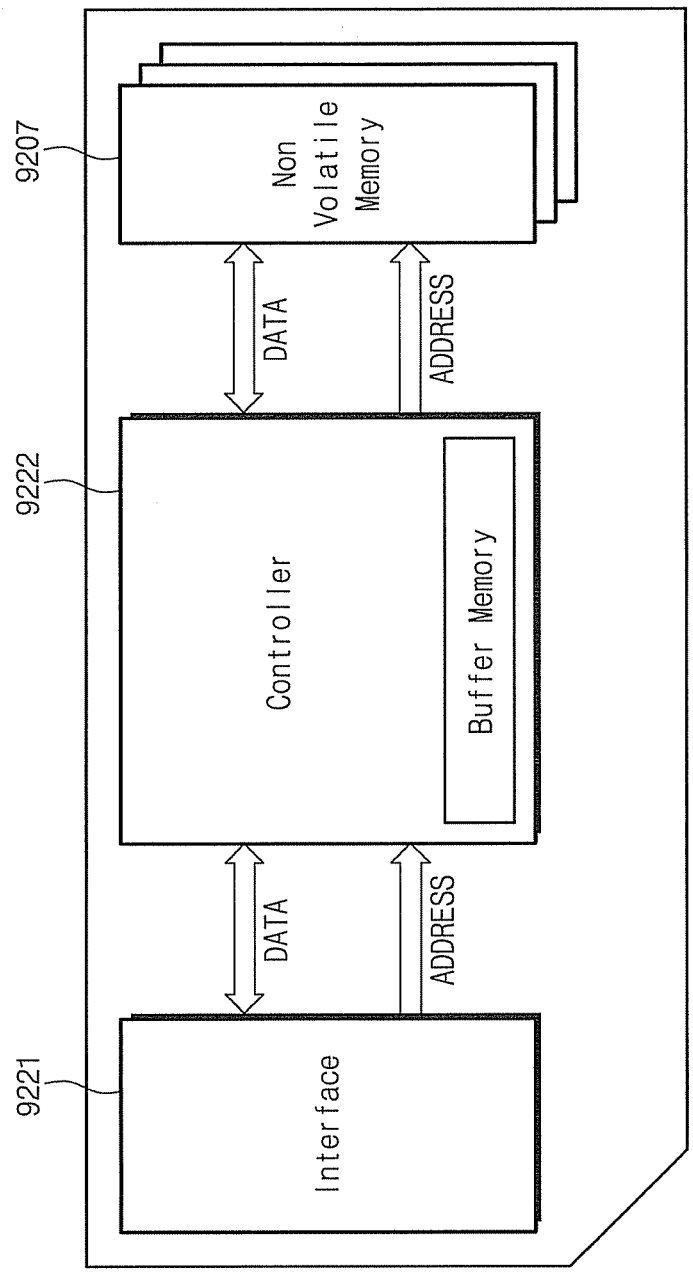

FIG. 23 is a block diagram illustrating a memory card according to embodiments of the inventive concepts. A memory card, for example, may be an MMC card, an SD card, a multiuse card, a micro-SD card, a memory stick, a compact SD card, an ID card, a PCMCIA card, an SSD card, a chip-card, a smartcard, an USB card, or the like.

Referring to FIG. 23, the memory card may include an interface circuit 9221 for interfacing with an external device, a controller 9222 including a buffer memory and controlling an operation of the memory card, and at least one non-volatile memory device 9207 according to embodiments of the inventive concepts. The controller 9222 may be a processor which is configured to control write and read operations of the non-volatile memory device 9207. In particular, the controller 9222 may be coupled with the non-volatile memory device 9207 and the interface circuit 2221 via a data bus and an address bus.

Figure 24:
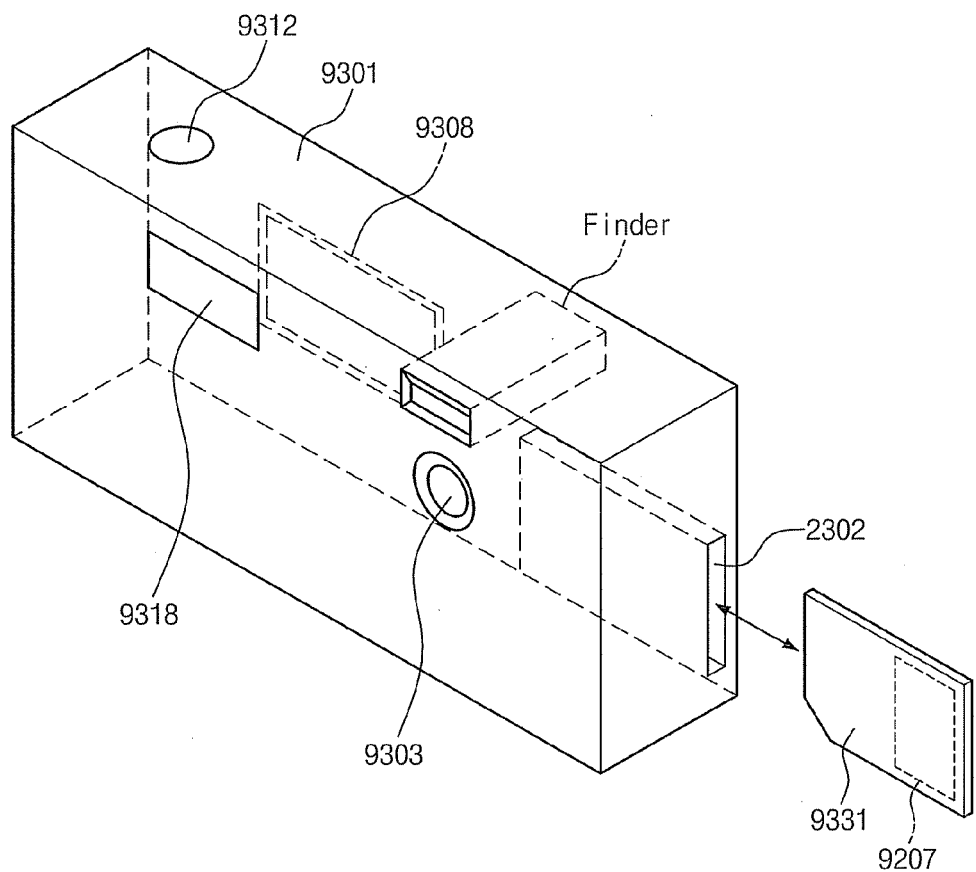

FIG. 24 is a block diagram illustrating a digital still camera according to an example embodiment of the inventive concepts.

Referring to FIG. 24, a digital still camera may include a body 9301, a slot 9302, a lens 9303, a display circuit 9308, a shutter button 9312, a strobe 9318, and the like. In particular, a memory card 9331 may be inserted in the slot 9308 and include at least one non-volatile memory device 9207 according to embodiments of the inventive concepts.

If the memory card 9331 is a contact type, an electric circuit on a circuit board may be electrically contacted with the memory card 9331 when inserted in the slot 9308. In the event that the memory card 9331 has a non-contact type, an electric circuit on a circuit board may communicate with the memory card 9331 in a radio-frequency manner.

Figure 25:
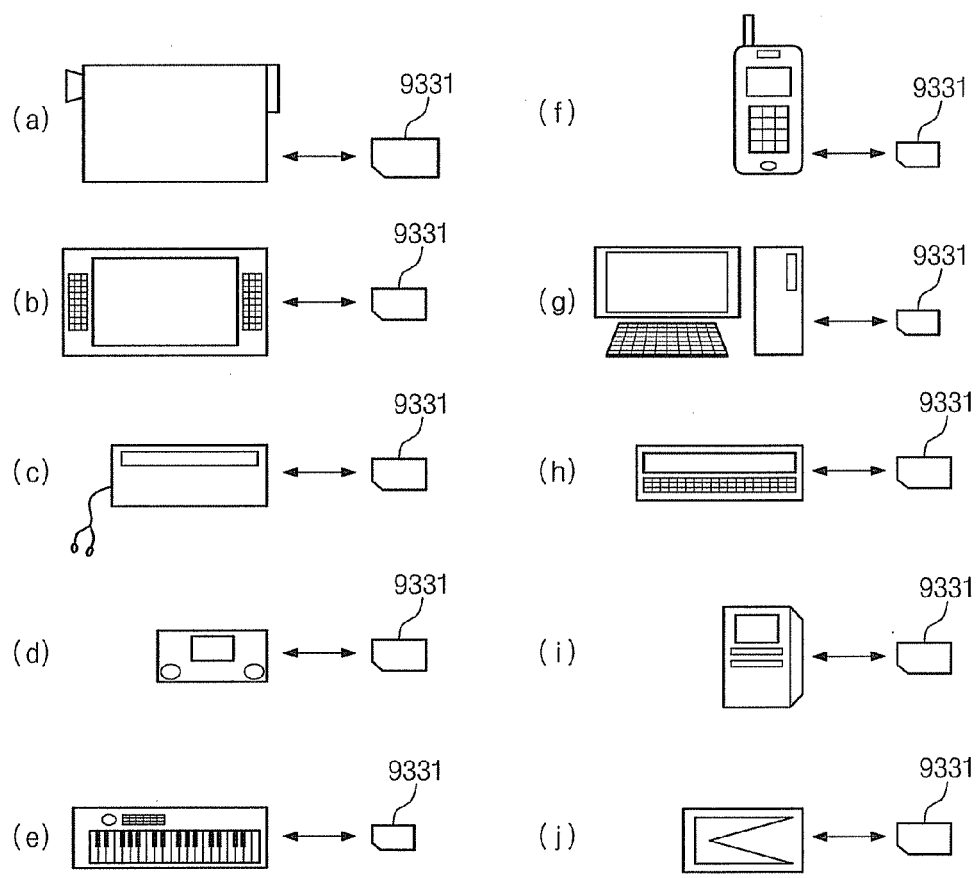

FIG. 25 is a diagram illustrating various systems to which a memory card in FIG. 23 is applied.

Referring to FIG. 25, a memory card 9331 may be applied to (a) a video camera, (b) a television, (c) an audio device, (d) a game machine, (e) an electronic music device, (f) a cellular phone, (g) a computer, (h) a Personal Digital Assistant (PDA), (i) a voice recorder, (j) a PC card, and the like.

Figure 26:
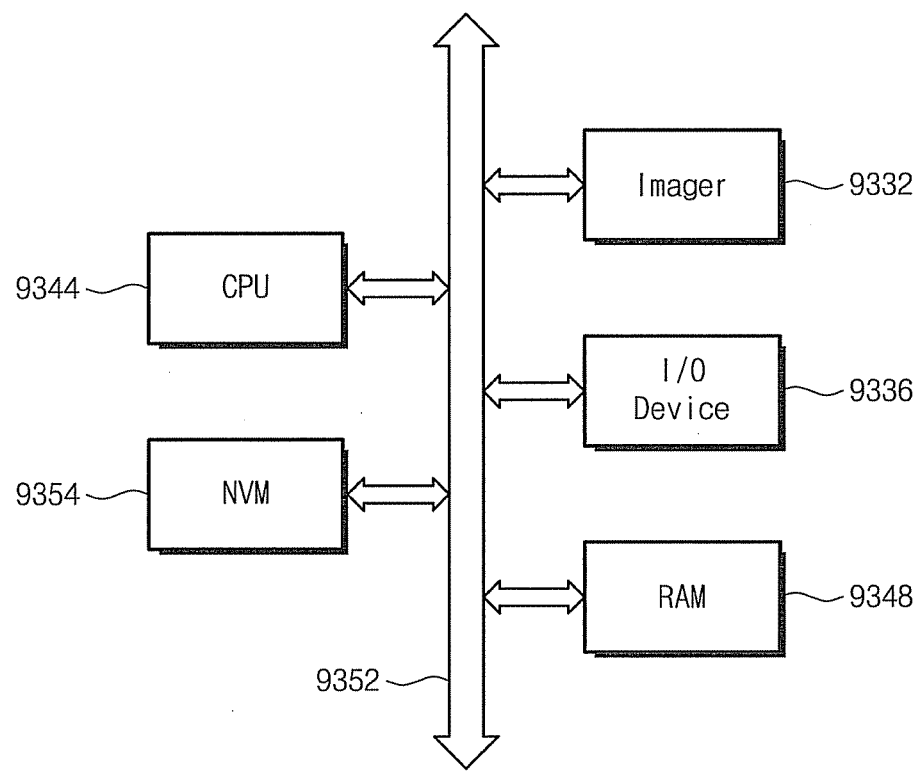

FIG. 26 is a block diagram illustrating an image sensor system according to an example embodiment of the inventive concepts.

Referring to FIG. 26, an image sensor system may include an image sensor 9332, an input/output device 9336, RAM 9348, CPU 9344, and a non-volatile memory device 9354 according to embodiments of the inventive concepts. Elements in FIG. 26 may communicate with one another via a bus 9352. The image sensor 9332 may include a photo sensing device such as a photo-gate, photo-diode, or the like. Elements in FIG. 26 may be formed of a single chip together with a processor or independently from the processor.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A method for reading memory cells in an array of non-volatile memory cells, the method comprising:
   receiving a request to read data stored in a first memory cell associated with a first word line;
   performing a first read operation on at least one memory cell associated with a second word line in response to the request, the second word line following the first word line in a word line programming order, and the first read operation being performed over a first time period;
   performing a second read operation on the first memory cell based on output from the first read operation, the second read operation being performed for a second time period, the first time period and the second time period being different.

2. The method of claim 1, wherein the first time period is shorter than the second time period.

3. The method of claim 2, wherein a duration of a sensing operation during the first read operation is less than a duration of a sensing operation during the second read operation.

4. The method of claim 1, wherein
   the performing a first read operation reads a flag memory cell associated with the second word line, the flag memory cell being programmed if at least one memory cell associated with the second word line is programmed; and the performing a second read operation reads the first memory cell using a first set of read voltages if the output from the first read operation indicates no memory cells associated with the second word line are programmed.

5. The method of claim 4, further comprising:
performing a third read operation on a memory cell of the second word line corresponding to the first memory cell if the output from the first read operation indicates at least one memory cell associated with the second word line has been programmed; and wherein the second read operation reads the first memory cell based on a programmed state of the corresponding memory cell.

6. The method of claim 5, wherein the second read operation reads the first memory cell using one the first set of read voltages and a second set of read voltages based on the programmed state of the corresponding memory cell, each of the second set of read voltages is higher than a corresponding voltage in the first set of read voltages.

7. The method of claim 6, wherein the second read operation reads the first memory cell using the first set of read voltages if the programmed state of the corresponding memory cell indicates that the first memory cell is not coupled to the corresponding memory cell, and the second read operation reads the first memory cell using the second set of read voltages if the programmed state of the corresponding memory cell indicates that the first memory cell is coupled to the corresponding memory cell.

8. The method of claim 1, wherein the performing a first read operation reads a memory cell of the second word line corresponding to the first memory cell.

9. The method of claim 8, wherein the second read operation reads the first memory cell using one the first set of read voltages and a second set of read voltage based on the state of the corresponding memory cell, each of the second set of read voltages is higher than a corresponding voltage in the first set of read voltages.

10. The method of claim 9, wherein
the second read operation reads the first memory cell using the first set of read voltages if one of (1) the corresponding memory cell is in an erased state and (2) the programmed state of the corresponding memory cell indicates that the first memory cell is not coupled to the corresponding memory cell; and the second read operation reads the first memory cell using the second set of read voltages if the programmed state of the corresponding memory cell indicates that the first memory cell is coupled to the corresponding memory cell.

11. A method for reading memory cells in an array of non-volatile memory cells, the method comprising:
receiving a request to read data stored in a first memory cell associated with a first word line;
determining whether at least one memory cell associated with a second word line has been programmed, the second word line following the first word line in a word line programming order;
performing a first read operation on a memory cell of the second word line corresponding to the first memory cell if the determining step determines that at least one memory cell associated with the second word line has been programmed, the first read operation being performed over a first time period;

performing a second read operation on the first memory cell based on at least one of (1) whether the determining step determines that at least one memory cell associated with a second word line has been programmed and (2) output from the first read operation, the second read operation being performed for a second period of time different than the first period of time.

12. The method of claim 11, wherein the determining step comprises:
reading a flag memory cell associated with the second word line, the flag memory cell being programmed if at least one memory cell associated with the second word line is programmed.

13. The method of claim 11, wherein the determining step comprises:
accessing a map, the map indicating which word lines have had at least one memory cell programmed.

14. The method of claim 11, further comprising:
receiving a read command for the second read operation accompanying a read command for the first read operation.

15. The method of claim 11, wherein a duration of a sensing operation during the first read operation is less than a duration of a sensing operation during the second read operation.

16. A method for reading memory cells in an array of non-volatile memory cells, the method comprising:
accessing a map in response to a request to read data stored in a first memory cell associated with a first word line, the map indicating which word lines have had at least one memory cell programmed; and
triggering a first read operation and a second read operation if the accessing indicates that at least one memory cell in the second word line has been programmed, the first read operation reading at least one memory cell in a second word line that corresponds to the first memory cell, the second word line following the first word line in a word line programming order, and the second read operation reading the first memory cell based on output from the first read operation.

17. The method of claim 16, wherein the triggering comprises:
sending a command structure to a memory device instructing to perform the first read operation and the second read operation.

18. The method of claim 17, further comprising:
sending a command structure to a memory device instructing to perform a third read operation if the accessing indicates that at least one memory cell associated with the second word line has not been programmed, the third read operation reading the first memory cell.

19. The method of claim 18, wherein the first read operation is performed for a period of time shorter than the second read operation and the third read operation.

20. The method of claim 19, wherein a duration of a sensing operation during the first read operation is less than a duration of sensing operation during the second read operation and the third read operation.

21. The method of claim 16, wherein the second read operation is performed for a period of time based on output from the first read operation.

22. The method of claim 21, wherein the first read operation is performed for a period of time equal to the second read operation if the first read operation indicates the first memory cell is coupled, and the first read operation is performed for a period of time less than the second read operation if the first read operation indicates the first memory cell is uncoupled.

23. The method of claim 22, wherein a duration of a sensing operation during the first read operation is less than a duration of a sensing operation during the second read operation if the first read operation indicates the first memory cell is uncoupled.

24. A non-volatile memory device, comprising:
an array of non-volatile memory cells arranged in rows coupled by word lines and columns coupled by bit lines;
control logic configured to receive a request to read data stored in a first memory cell associated with a first word line, the control logic configured to perform a first read operation on at least one memory cell associated with a second word line in response to the request, the second word line following the first word line in a word line programming order, and the first read operation being performed over a first time period; and
the control logic configured to perform a second read operation on the first memory cell based on output from the first read operation, the second read operation being performed for a second time period, the second read operation being performed for a second time period, the first time period being shorter than the second time period if output from performing the first read operation indicates the first memory cell is not coupled.

25. An electronic device comprising:
the memory device of claim 24; an
a processor processing output from the second read operation.

26. A memory card comprising:
a card interface; and
a controller for controlling an exchange of data between the card interface and a memory device of claim 24.

27. A data storage device comprising:
a plurality of memory modules composing a RAID array, and each including at least one memory device and a memory controller for controlling an operation of the associated at least one memory device; and
a RAID controller for controlling an operation of the plurality of modules, wherein each of the memory devices is the memory device of claim 24.

* * * * *

UNITED STATES PATENT AND TRADEMARK OFFICE
CERTIFICATE OF CORRECTION

PATENT NO. : 8,537,621 B2  Page 1 of 1
APPLICATION NO. : 13/094192
DATED : September 17, 2013
INVENTOR(S) : Ji-Sang Lee et al.

It is certified that error appears in the above-identified patent and that said Letters Patent is hereby corrected as shown below:

Title page item (75), should read:

Inventors: Ji-Sang Lee, Iksan-si (KR); Kihwan Choi, Seongnam-si (KR)

Signed and Sealed this
Seventeenth Day of December, 2013

Margaret A. Focarino
*Commissioner for Patents of the United States Patent and Trademark Office*